US012685164B2

(12) United States Patent
Lee et al.

(10) Patent No.: US 12,685,164 B2
(45) Date of Patent: Jul. 14, 2026

(54) SEMICONDUCTOR PACKAGE AND COOLING SYSTEM THEREOF

(71) Applicant: SAMSUNG ELECTRONICS CO., LTD., Suwon-si (KR)

(72) Inventors: Jonggyu Lee, Suwon-si (KR); Sunggu Kang, Suwon-si (KR); Jaechoon Kim, Suwon-si (KR); Taehwan Kim, Suwon-si (KR); Hwanjoo Park, Suwon-si (KR); Kyungsuk Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 713 days.

(21) Appl. No.: 18/066,861

(22) Filed: Dec. 15, 2022

(65) Prior Publication Data

US 2023/0307318 A1     Sep. 28, 2023

(30) Foreign Application Priority Data

Mar. 23, 2022     (KR) ......................... 10-2022-0036230

(51) Int. Cl.
| | |
|---|---|
| *H10W 40/47* | (2026.01) |
| *H10W 70/60* | (2026.01) |
| *H10W 74/10* | (2026.01) |
| *H10W 90/00* | (2026.01) |

(52) U.S. Cl.
CPC .......... *H10W 40/47* (2026.01); *H10W 70/611* (2026.01); *H10W 74/117* (2026.01); *H10W 90/00* (2026.01); *H10W 90/401* (2026.01)

(58) Field of Classification Search
CPC ............... H01L 23/473; H01L 23/3128; H01L 23/5385; H01L 25/18; H01L 23/3135; H01L 23/4735; H01L 23/49816; H01L 2224/73204; H01L 2225/06513; H01L 2225/06586; H01L 25/0652; H01L 2225/06517; H01L 2225/06541; H01L 2225/06589; H01L 23/367; H01L 23/3107; H01L 23/3171; H01L 24/97; H01L 25/0655; H01L 25/0657
See application file for complete search history.

(56) References Cited

U.S. PATENT DOCUMENTS

| | | | |
|---|---|---|---|
| 7,787,248 | B2 | 8/2010 | Campbell et al. |
| 8,081,461 | B2 | 12/2011 | Campbell et al. |
| 8,266,802 | B2 | 9/2012 | Campbell et al. |

(Continued)

*Primary Examiner* — Jeff W Natalini
*Assistant Examiner* — Nicholas Leland Hutson
(74) *Attorney, Agent, or Firm* — Wolf, Greenfield & Sacks, P.C.

(57) ABSTRACT

A semiconductor package includes a package substrate; an interposer on the package substrate; a first semiconductor chip on the interposer; at least one second semiconductor chip on the interposer; a molding layer extending around the first semiconductor chip and the at least one second semiconductor chip; a barrier layer on the upper surface of the molding layer; a separation wall on the barrier layer, the separation wall configured to define a first cooling space adjacent the first semiconductor chip and a second cooling space adjacent the at least one second semiconductor chip; and a heat dissipation structure on the separation wall, wherein the heat dissipation structure provides a cooling channel through which the cooling fluid flows.

20 Claims, 36 Drawing Sheets

(56)                    References Cited

U.S. PATENT DOCUMENTS

| | | | |
|---|---|---|---|
| 9,247,672 | B2 | 1/2016 | Mehring |
| 10,332,823 | B2 | 6/2019 | Chen et al. |
| 10,700,017 | B2 | 6/2020 | Leobandung |
| 10,964,624 | B2 | 3/2021 | Gutala et al. |
| 10,964,625 | B2 | 3/2021 | Jain et al. |
| 10,966,352 | B2 | 3/2021 | Yengar et al. |
| 10,985,089 | B2 | 4/2021 | Hart et al. |
| 11,044,835 | B2 | 6/2021 | Chiu et al. |
| 11,177,192 | B2 | 11/2021 | Teng et al. |
| 2005/0083655 | A1* | 4/2005 | Jairazbhoy .......... H01L 23/3733 |
| | | | 257/E23.098 |
| 2005/0111188 | A1* | 5/2005 | Bhattacharya ........ H01L 23/427 |
| | | | 361/708 |
| 2011/0103019 | A1 | 5/2011 | Campbell et al. |
| 2013/0082377 | A1* | 4/2013 | Bennion ................ H01L 23/36 |
| | | | 165/170 |
| 2021/0098335 | A1* | 4/2021 | Yu ...................... H01L 25/0655 |
| 2021/0159139 | A1 | 5/2021 | Yu et al. |
| 2021/0242108 | A1 | 8/2021 | Jensen et al. |
| 2021/0280497 | A1 | 9/2021 | Brun et al. |
| 2022/0149030 | A1* | 5/2022 | Lin ...................... H01L 23/562 |
| 2025/0132219 | A1* | 4/2025 | Hirano ............... H01L 23/3736 |

\* cited by examiner

VIIB-VIIB'

SEMICONDUCTOR PACKAGE AND COOLING SYSTEM THEREOF

CROSS-REFERENCE TO RELATED APPLICATION

This application is based on and claims priority under 35 U.S.C. § 119 to Korean Patent Application No. 10-2022-0036230, filed on Mar. 23, 2022, in the Korean Intellectual Property Office, the disclosure of which is incorporated by reference herein in its entirety.

BACKGROUND

The inventive concept relates generally to semiconductor packages and, more particularly, to cooling semiconductor packages.

There is increased demand for semiconductor devices with enhanced functionality. In order to meet performance and price requirements of consumers, the degree of integration and miniaturization of semiconductor elements has increased. To satisfy these demands multiple semiconductor chips are being provided within smaller packages. Unfortunately, heat generated by multiple semiconductor chips in a single package may hinder performance and/or cause thermal stress.

SUMMARY

The inventive concept provides a semiconductor package capable of cooling using a cooling fluid and a cooling system thereof.

According to an aspect of the inventive concept, there is provided a semiconductor package including: a package substrate; an interposer on the package substrate; a first semiconductor chip on the interposer; at least one second semiconductor chip on the interposer; a molding layer extending around the first semiconductor chip and the at least one second semiconductor chip; a barrier layer on an upper surface of the molding layer; a separation wall on the barrier layer, the separation wall configured to define a first cooling space adjacent the first semiconductor chip and a second cooling space adjacent the at least one second semiconductor chip, wherein the separation wall is configured to allow a cooling fluid to flow between the first cooling space and the second cooling space; and a heat dissipation structure on the separation wall adjacent the first cooling space and the second cooling space, wherein the heat dissipation structure includes: an inlet; an outlet; a cooling channel in fluid communication with the inlet, the first cooling space and the second cooling space, wherein the cooling channel is configured to receive the cooling fluid from the inlet and direct the cooling fluid into the first cooling space and the second cooling space; and an outflow channel in fluid communication with the first cooling space and the outlet, wherein the outflow channel is configured to discharge the cooling fluid from the first cooling space through the outlet.

According to another aspect of the inventive concept, there is provided a semiconductor package including: a plurality of semiconductor chips; a molding layer extending around the plurality of semiconductor chips; a barrier layer on an upper surface of the molding layer and including a metal; a separation wall on the barrier layer, the separation wall configured to define a plurality of cooling spaces adjacent the plurality of semiconductor chips and to allow a cooling fluid to flow between the plurality of cooling spaces;

and a heat dissipation structure adjacent the plurality of cooling spaces and contacting the separation wall, the heat dissipation structure includes: an inlet; an outlet; a cooling channel in fluid communication with the inlet and the plurality of cooling spaces, wherein the cooling channel is configured to receive the cooling fluid from the inlet and direct the cooling fluid into the plurality of cooling spaces; and an outflow channel in fluid communication with the plurality of cooling spaces and the outlet, wherein the outflow channel is configured to discharge the cooling fluid from the plurality of cooling spaces through the outlet.

According to an aspect of the inventive concept, there is provided a cooling system for cooling a semiconductor package, the cooling system including: a package substrate; an interposer on the package substrate; a first semiconductor chip on the interposer; at least one second semiconductor chip on the interposer; a molding layer extending around the first semiconductor chip and the at least one second semiconductor chip; a barrier layer on an upper surface of the molding layer; a separation wall on the barrier layer, the separation wall configured to define a first cooling space adjacent the first semiconductor chip and a second cooling space adjacent the at least one second semiconductor chip, wherein the separation wall is configured to allow a cooling fluid to flow between the first cooling space and the second cooling space; and a heat dissipation structure on the separation wall adjacent the first cooling space and the second cooling space, wherein the heat dissipation structure comprises an inlet, an outlet, a cooling channel in fluid communication with the inlet and the second cooling space, and an outflow channel in fluid communication with the first cooling space and the outlet; a water cooling pump configured to provide the cooling fluid to the inlet of the heat dissipation structure; and a heat dissipater configured to collect the cooling fluid discharged from the outlet of the heat dissipation structure, wherein the cooling channel is configured to provide the cooling fluid into the second cooling space to cool the second semiconductor chip, and the separation wall is configured to allow the cooling fluid to flow from the second cooling space into the first cooling space to cool the first semiconductor chip.

BRIEF DESCRIPTION OF THE DRAWINGS

Embodiments of the inventive concept will be more clearly understood from the following detailed description taken in conjunction with the accompanying drawings in which:

FIGS. 1B to 1G are plan views taken along levels LV1 to LV6 of FIG. 1A, respectively;

FIG. 4A is a cross-sectional view illustrating a cooling system of a semiconductor package according to example embodiments of the inventive concept;

FIG. 5B is a cross-sectional view taken along line VB-VB' of FIG. 5A;

FIG. 6A is a cross-sectional view illustrating a semiconductor package according to example embodiments of the inventive concept;

FIG. 6B is a cross-sectional view taken along line VIB-VIB' of FIG. 6A;

FIG. 7A is a cross-sectional view illustrating a semiconductor package according to example embodiments of the inventive concept;

FIGS. 8 to 11 are cross-sectional views illustrating a heat dissipation structure according to example embodiments of the inventive concept; and FIGS. 12A to 12G are cross-sectional views illustrating a method of manufacturing a semiconductor package according to example embodiments.

DETAILED DESCRIPTION OF THE EMBODIMENTS

Figure 1A:
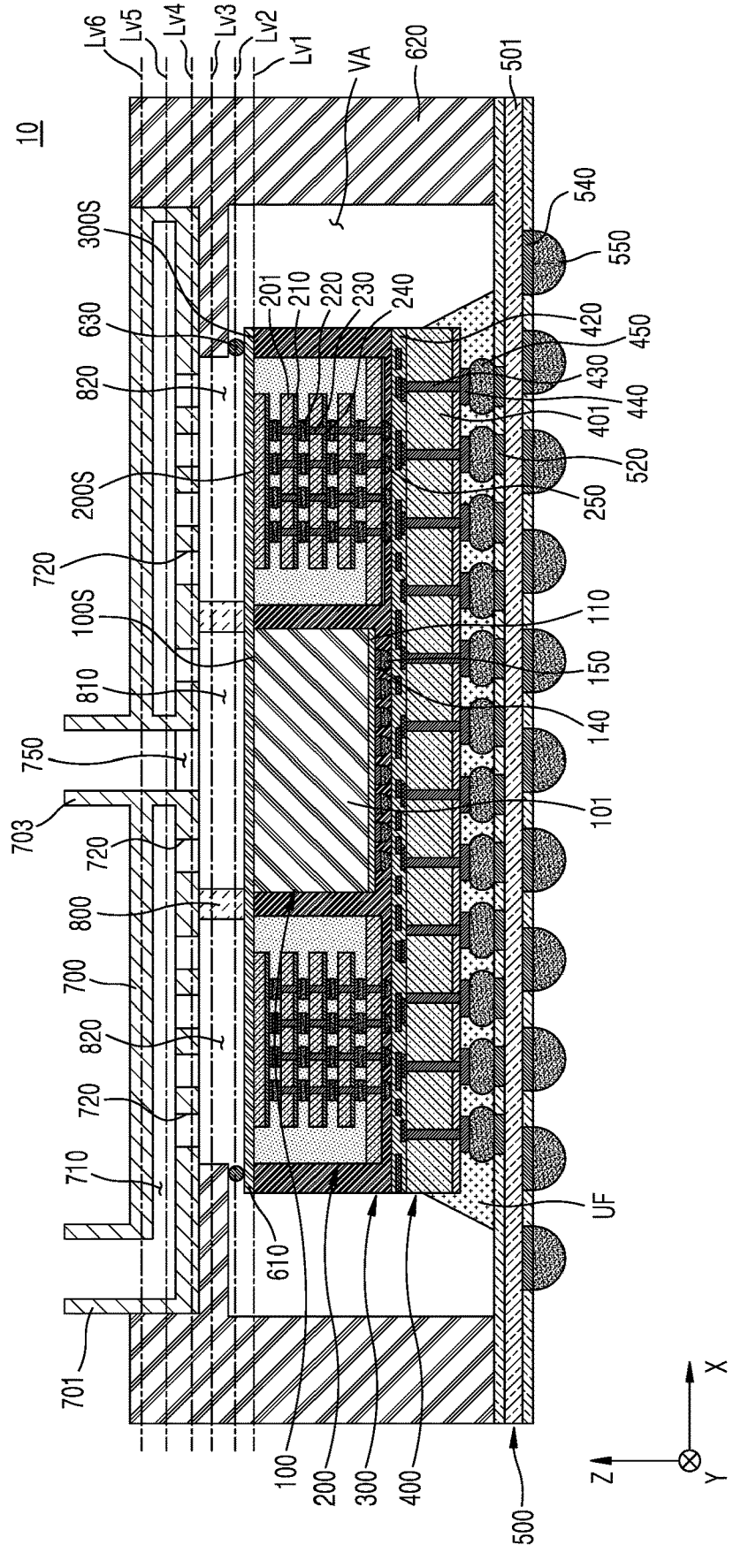
FIG. 1A is a cross-sectional view illustrating main components of a semiconductor package according to example embodiments of the inventive concept.

Hereinafter, embodiments of the technical idea of the inventive concept will be described in detail with reference to the accompanying drawings. The same reference numerals are used for the same components in the drawings, and redundant descriptions thereof will be omitted.

FIG. 1A is a cross-sectional view illustrating main components of a semiconductor package 10 according to example embodiments of the inventive concept. FIGS. 1B to 1G are plan views taken along levels LV1 to LV6 of FIG. 1A, respectively.

Referring to FIGS. 1A to 1G, the semiconductor package 10 may include a first semiconductor chip 100, a second semiconductor chip 200, a molding layer 300, an interposer 400, a package substrate 500, a moisture absorption barrier layer 610, a support structure 620, a sealing ring 630, a heat dissipation structure 700, and a separation wall 800.

Figure 1B:
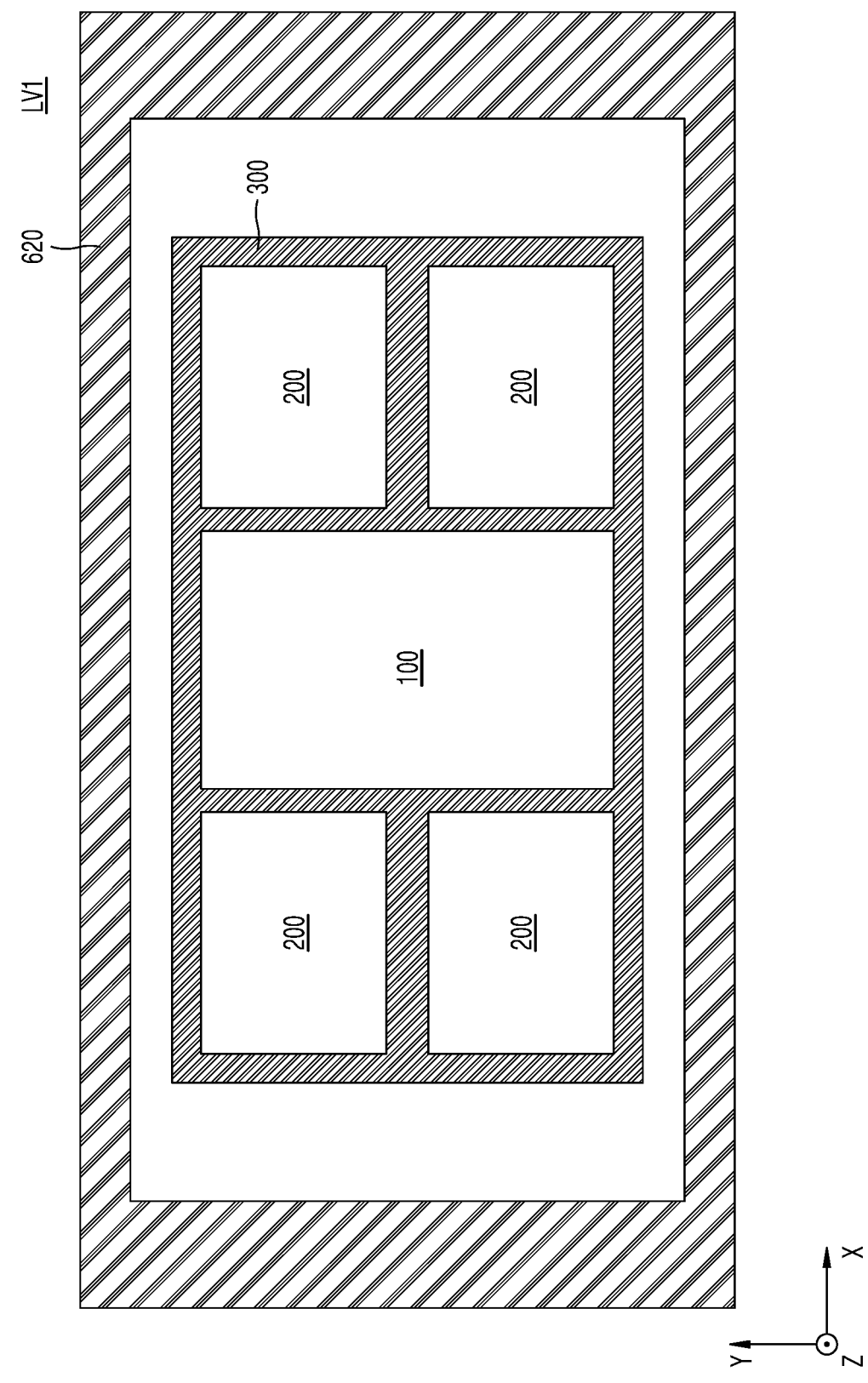
Figure 1C:
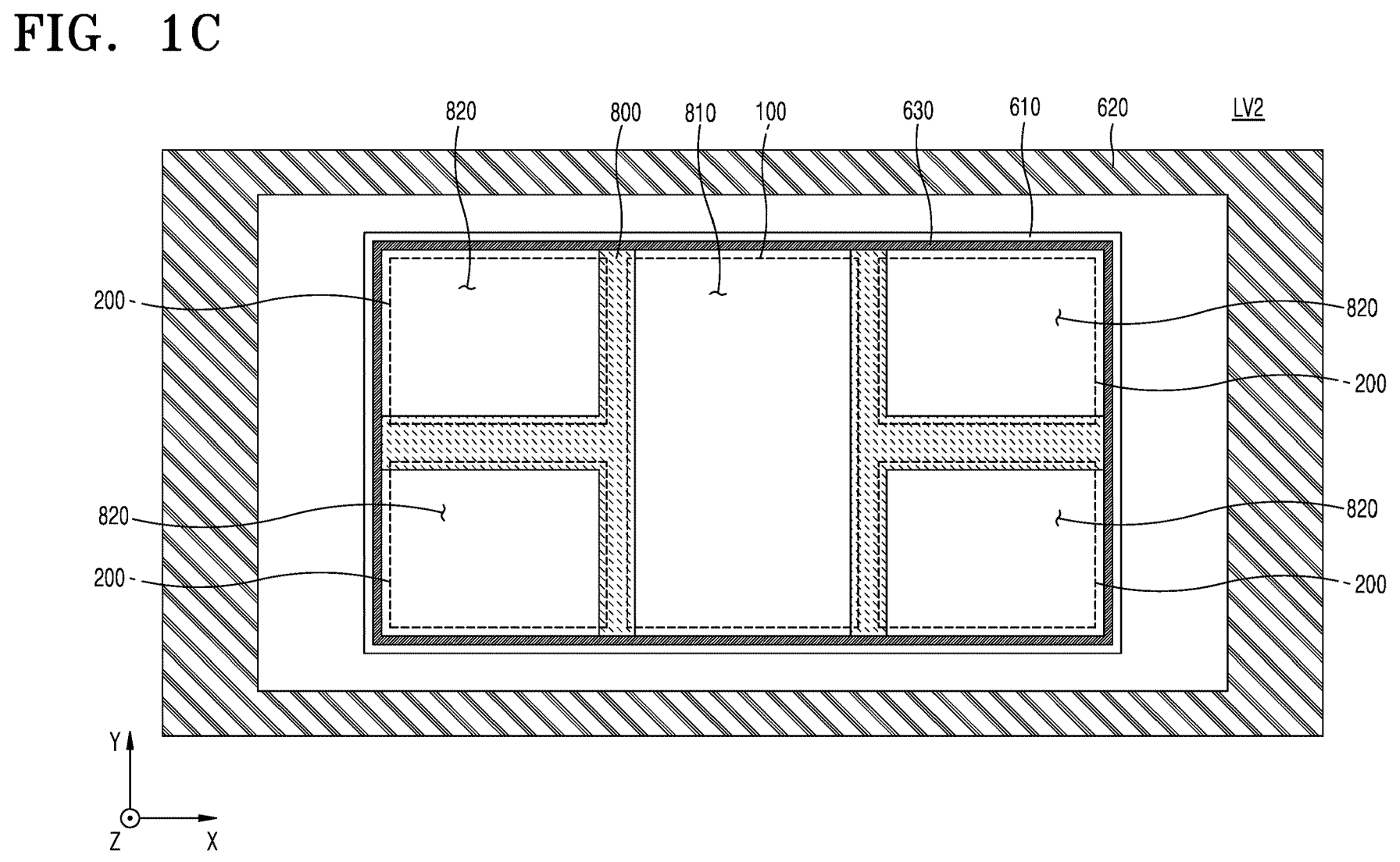

The semiconductor package 10 may include the first semiconductor chip 100 and the second semiconductor chip 200, which perform different functions. The semiconductor package 10 may include one or more first semiconductor chips 100 and one or more second semiconductor chips 200. The first and second semiconductor chips 100 and 200 may be arranged side by side in a first horizontal direction (e.g., an X direction) and/or a second horizontal direction (e.g., a Y direction), and may be electrically connected to each other through the interposer 400. As shown in FIG. 1B, four second semiconductor chips 200 may be arranged around the first semiconductor chip 100. That is, two second semiconductor chips 200 may be arranged adjacent to one edge of an upper surface 100S of the first semiconductor chip 100, and two second semiconductor chips 200 may be arranged adjacent to the other edge of the upper surface 1000S of the first semiconductor chip 100.

The first semiconductor chip 100 may include a logic chip. The logic chip may include a plurality of logic devices (not shown) therein. Each of the logic devices may refer to, for example, a device including a logic circuit, such as an AND, an OR, a NOT, a flip-flop, or the like, thereby performing various signal processing. In some embodiments, the logic devices may include devices performing signal processing, such as analog signal processing, analog-to-digital conversion, control, and the like.

In some embodiments, the first semiconductor chip 100 may be implemented as a microprocessor, a graphics processor, a signal processor, a network processor, a chipset, an audio codec, a video codec, an application processor, a system on chip, and the like, depending on the function of the first semiconductor chip 100.

The second semiconductor chip 200 may include a volatile memory chip and/or a nonvolatile memory chip. The volatile memory chip may include, for example, dynamic random access memory (DRAM), static RAM (SRAM), or thyristor RAM (TRAM). The nonvolatile memory chip may include, for example, flash memory, magnetic RAM (MRAM), spin-transfer torque MRAM (STT-MRAM), ferroelectric RAM (FRAM), phase change RAM (PRAM), or resistive RAM (RRAM).

In some embodiments, the second semiconductor chip 200 may include a memory chiplet including a plurality of memory chips capable of merging data therebetween. In addition, the second semiconductor chip 200 may include a high bandwidth memory (HBM) chip.

Each component constituting the first and second semiconductor chips 100 and 200 will be described in detail below.

The first semiconductor chip 100 may include a first semiconductor substrate 101, a first semiconductor interconnect layer 110, a first connection pad 140, and a first connection member 150.

The first semiconductor chip 100 may include a single slice, and the single slice may include the first semiconductor substrate 101. The first semiconductor substrate 101 may include an active surface and an inactive surface facing each other as a wafer. Here, the inactive surface of the first semiconductor substrate 101 may include an upper surface 100S of the first semiconductor chip 100 exposed from the molding layer 300.

The first semiconductor substrate 101 may include, for example, a silicon (Si) wafer including crystalline silicon, polycrystalline silicon, or amorphous silicon. Alternatively, the first semiconductor substrate 101 may include a semiconductor element, such as germanium, or a compound semiconductor, such as silicon carbide (SiC), gallium arsenide (GaAs), indium arsenide (InAs), and indium phosphide (InP).

Meanwhile, the first semiconductor substrate 101 may have a silicon on insulator (SOI) structure. For example, the first semiconductor substrate 101 may include a buried oxide (BOX) layer. In some embodiments, the first semiconductor substrate 101 may include a conductive region, for example, a well doped with impurities or a structure doped with impurities. In addition, the first semiconductor substrate 101 may have various device isolation structures, such as a shallow trench isolation (STI) structure.

The first semiconductor interconnect layer 110 may be arranged on the active surface of the first semiconductor substrate 101 and may be electrically connected to the first connection pad 140 on the first semiconductor interconnect layer 110. The first semiconductor interconnect layer 110 may be electrically connected to the first connection member 150 through the first connection pad 140. The first connection pad 140 may include, for example, at least one of aluminum (Al), copper (Cu), nickel (Ni), tungsten (W), platinum (Pt), and gold (Au).

The first connection member 150 may be arranged to electrically connect the first semiconductor chip 100 to the interposer 400. The first connection member 150 may include a solder ball attached to the first connection pad 140. The material constituting the solder ball may include at least one of gold (Au), silver (Ag), copper (Cu), tin (Sn), and aluminum (Al). In some embodiments, the solder ball may be connected to the first connection pad 140 by any one of a thermal compression connection and an ultrasonic connection, and may be connected to the first connection pad 140 by a thermosonic connection method, which is obtained by combining a thermal compression connection method with an ultrasonic connection method.

At least one of a control signal, a power signal, and a ground signal for operation of the first semiconductor chip 100 may be provided from the outside through the first connection member 150, or a data signal to be stored in the first semiconductor chip 100 may be externally provided through the first connection member 150, or data stored in the first semiconductor chip 100 may be provided to the outside through the first connection member 150.

The second semiconductor chip 200 may include a second semiconductor substrate 201, a second semiconductor interconnect layer 210, a second upper connection pad 220, a second through electrode 230, a second lower connection pad 240, and a second connection member 250.

The second semiconductor chip 200 may include a plurality of slices, and each of the plurality of slices may include the second semiconductor substrate 201. The plurality of second semiconductor substrates 201 constitute a chip stack and may be stacked in a vertical direction (Z-direction). The plurality of second semiconductor substrates 201 may be substantially the same as each other. That is, the second semiconductor chip 200 may have a structure in which each of a plurality of slices operates as a memory chip and is stacked to allow data to be merged with each other.

Each of the plurality of second semiconductor substrates 201 may have an active surface and an inactive surface facing each other. Here, an inactive surface of the uppermost one among the plurality of second semiconductor substrates 201 may include an upper surface 200S of the second semiconductor chip 200 exposed from the molding layer 300. The remainder of the plurality of second semiconductor substrates 201, except for the uppermost one, may include the second through electrode 230 passing therethrough. The second through electrode 230 may include, for example, a through silicon via (TSV).

The second upper connection pad 220 and the second lower connection pad 240 may be electrically connected to the upper and lower parts of the second through electrode 230. In addition, the second lower connection pad 240 may be electrically connected to the second semiconductor interconnect layer 210 on the active surface of the second semiconductor substrate 201. The second semiconductor interconnect layer 210 may be electrically connected to the second connection member 250 through the second lower connection pad 240.

The second connection member 250 contacting the lowermost one of the plurality of second semiconductor substrates 201 may electrically connect the second semiconductor chip 200 to the interposer 400. The second connection member 250 may include a solder ball attached to the second lower connection pad 240.

At least one of a control signal, a power signal, and a ground signal for operation of the second semiconductor chip 200 may be provided from the outside through the second connection member 250, or a data signal to be stored in the second semiconductor chip 200 may be externally provided through the second connection member 250, or data stored in the second semiconductor chip 200 may be provided to the outside through the second connection member 250.

The molding layer 300 may be formed to surround the first and second semiconductor chips 100 and 200. Specifically, the molding layer 300 may extend along the side and lower surfaces of each of the first and second semiconductor chips 100 and 200, and cover the side and lower surface of each of the first and second semiconductor chips 100 and 200. Here, the molding layer 300 may not cover the upper surface 100S of the first semiconductor chip 100 and the upper surface 200S of the second semiconductor chip 200. Accordingly, at the first level LV1, an upper surface 300S of the molding layer 300 may be coplanar with the upper surface 100S of the first semiconductor chip 100 and the upper surface 200S of the second semiconductor chip 200.

The molding layer 300 may protect the first and second semiconductor chips 100 and 200 from external influences, such as impact and contamination. To perform this role, the molding layer 300 may be made of an epoxy mold compound or a resin. In addition, the molding layer 300 may be formed by a process, such as compression molding, lamination, screen printing, or the like.

The interposer 400 may be arranged below the first and second semiconductor chips 100 and 200, and may electrically connect the first semiconductor chip 100 and the second semiconductor chip 200 to each other. In some embodiments, the interposer 400 may include a silicon substrate 401 and may include a redistribution structure 420 arranged on an upper portion of the silicon substrate 401. The interposer 400 may include a through electrode 430 electrically connected to the redistribution structure 420 and penetrating the silicon substrate 401, a connection pad 440 arranged below the silicon substrate 401 and electrically connected to the through electrode 430, and an internal connection terminal 450 attached to the connection pad 440.

A package substrate 500 may be arranged below the interposer 400. The package substrate 500 may be formed on the basis of a printed circuit board, a wafer substrate, a ceramic substrate, a glass substrate, or the like. In example embodiments, the package substrate 500 may include a printed circuit board. The package substrate 500 may include a bump pad 540 arranged under a lower surface of a body portion 501 and an external connection terminal 550 attached to the bump pad 540. The semiconductor package 10 may be electrically connected to a main board or a system board of an external electronic device on which the semiconductor package 10 is mounted through the external connection terminal 550.

An underfill UF may be formed between the interposer 400 and the package substrate 500. The underfill UF may be between the interposer 400 and the package substrate 500 to surround the internal connection terminal 450. The underfill UF may be made of, for example, an epoxy resin. In some embodiments, a non-conductive film (NCF) other than the underfill (UF) may be formed.

The moisture absorption barrier layer 610 may be arranged on the molding layer 300, the first semiconductor chip 100, and the second semiconductor chip 200. The moisture absorption barrier layer 610 may conformally extend along (i.e., conform to various configurations, levels, shapes, etc., of) the upper surface 300S of the molding layer 300, the upper surface 100S of the first semiconductor chip 100, and/or the upper surface 200S of the second semiconductor chip 200. The moisture absorption barrier layer 610 may cover the upper surface 300S of the molding layer 300, the upper surface 100S of the first semiconductor chip 100, and/or the upper surface 200S of the second semiconductor chip 200.

In example embodiments, the moisture absorption barrier layer 610 may entirely cover the upper surface 300S of the molding layer 300, the upper surface 100S of the first semiconductor chip 100, and/or the upper surface 200S of the second semiconductor chip 200. In example embodiments, the moisture absorption barrier layer 610 may entirely cover the upper surface 300S of the molding layer 300, but may not cover at least a part of the upper surface 100S of the first semiconductor chip 100 and/or at least a part of the upper surface 200S of the second semiconductor chip 200.

The moisture absorption barrier layer 610 may prevent a cooling fluid (CT of FIG. 4A) from penetrating the molding layer 300, the first semiconductor chip 100, and/or the second semiconductor chip 200. That is, the moisture absorption barrier layer 610 may be configured to prevent the cooling fluid CT from being absorbed or adsorbed to the molding layer 300, the first semiconductor chip 100, and/or the second semiconductor chip 200. In example embodiments, the moisture absorption barrier layer 610 may include a waterproof material, such as metal, silicon (Si), or the like. For example, the moisture absorption barrier layer 610 may include material layers stacked in a vertical direction (e.g., a Z direction). For example, the moisture absorption barrier layer 610 may include titanium (Ti), copper (Cu), nickel (Ni), gold (Au), silver (Ag), aluminum (Al), silicon (Si), or a combination thereof. For example, the moisture absorption barrier layer 610 may include a first layer including titanium (Ti) and a second layer including at least one of copper (Cu), nickel (Ni), and silicon (Si).

In addition, the moisture absorption barrier layer 610 includes a material having excellent thermal conductivity, such as metal, and thus may facilitate cooling of the first semiconductor chip 100 and cooling of the second semiconductor chip 200 using the cooling fluid CT. When the moisture absorption barrier layer 610 is formed to cover the upper surface 100S of the first semiconductor chip 100 and the upper surface 200S of the second semiconductor chip 200, heat generated from the first semiconductor chip 100 and heat generated from the second semiconductor chip 200 may be transferred to the cooling fluid CT through the moisture absorption barrier layer 610.

The separation wall 800 may be arranged on the moisture absorption barrier layer 610. The separation wall 800 may cover the upper surface 300S of the molding layer 300 between the upper surface 100S of the first semiconductor chip 100 and the upper surface 200S of the second semiconductor chip 200. In a plan view, the separation wall 800 may cover the upper surface 300S of the molding layer 300 between the upper surface 100S of the first semiconductor chip 100 and the upper surface 200S of the second semiconductor chip 200 and the upper surface 300S of the molding layer 300 between the upper surfaces of the two adjacent first semiconductor chips 100. In a plan view, the separation wall 800 may extend along a boundary between the first semiconductor chip 100 and the molding layer 300, and may extend along a boundary between the second semiconductor chip 200 and the molding layer 300. According to example embodiments, the upper surface 300S of the molding layer 300 may be doubly covered by the moisture absorption barrier layer 610 and the separation wall 800, as illustrated in FIG. 1A, thereby effectively preventing the cooling fluid CT from being absorbed by the molding layer 300.

The separation wall 800 may define a first cooling space 810 adjacent (e.g., overlying) the first semiconductor chip 100 in a vertical direction (for example, in a Z direction) and a second cooling space 820 adjacent (e.g., overlying) the second semiconductor chip 200, as illustrated in FIG. 1A. When viewed in a plan view, the first cooling space 810 directly overlies the first semiconductor chip 100 in a vertical direction (e.g., the Z direction), but does not directly overlie the second semiconductor chip 200, as illustrated in FIG. 1A. When viewed in a plan view, the second cooling space 820 directly overlies the second semiconductor chip 200 in a vertical direction (e.g., the Z direction), but does not directly overlie the first semiconductor chip 100, as illustrated in FIG. 1A. When viewed in a plan view, the first cooling space 810 and the second cooling space 820 may be separated or partitioned from each other by the separation wall 800. Furthermore, when viewed in a plan view, the first cooling spaces 810 adjacent to each other may be separated or partitioned from each other by the separation wall 800.

The separation wall 800 may be configured to allow the cooling fluid CT to pass or transmit therethrough. For example, the separation wall 800 may include a passage for passing or transmitting the cooling fluid CT. The cooling fluid CT may flow through the passage of the separation wall 800 between the first cooling space 810 and the second cooling space 820, and the cooling fluid CT may flow through the passage of the separation wall 800 between the adjacent first cooling spaces 810. The separation wall 800 may be formed of a metal material or a non-metal material. In example embodiments, the separation wall 800 may include a porous material. In embodiments, the separation wall 800 may include a metal foam such as copper foam or nickel foam, a plastic foam, and/or a mesh structure. For example, the thickness of the separation wall 800 may range between about 100 micrometers (μm) and about 1,000 μm, but is not limited thereto.

In example embodiments, a material layer formed of a material different from that of the separation wall 800 may be between the separation wall 800 and the moisture absorption barrier layer 610. The material layer may increase adhesion between the separation wall 800 and the moisture absorption barrier layer 610, or may prevent a part of the moisture absorption barrier layer 610 overlapping the upper surface 300S of the molding layer 300 from directly contacting the cooling fluid CT passing through the separation wall 800.

Figure 1D:
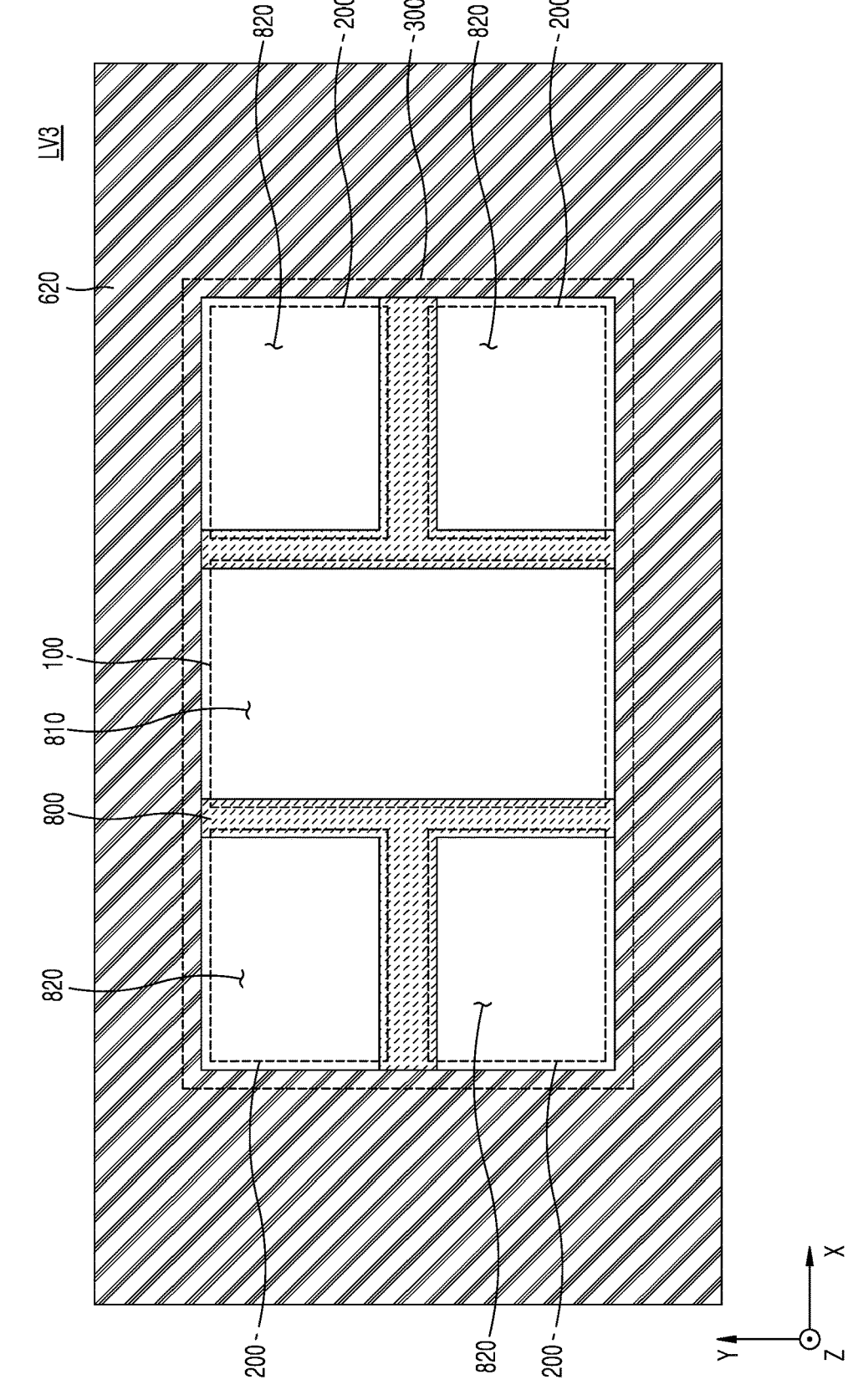
Figure 1E:
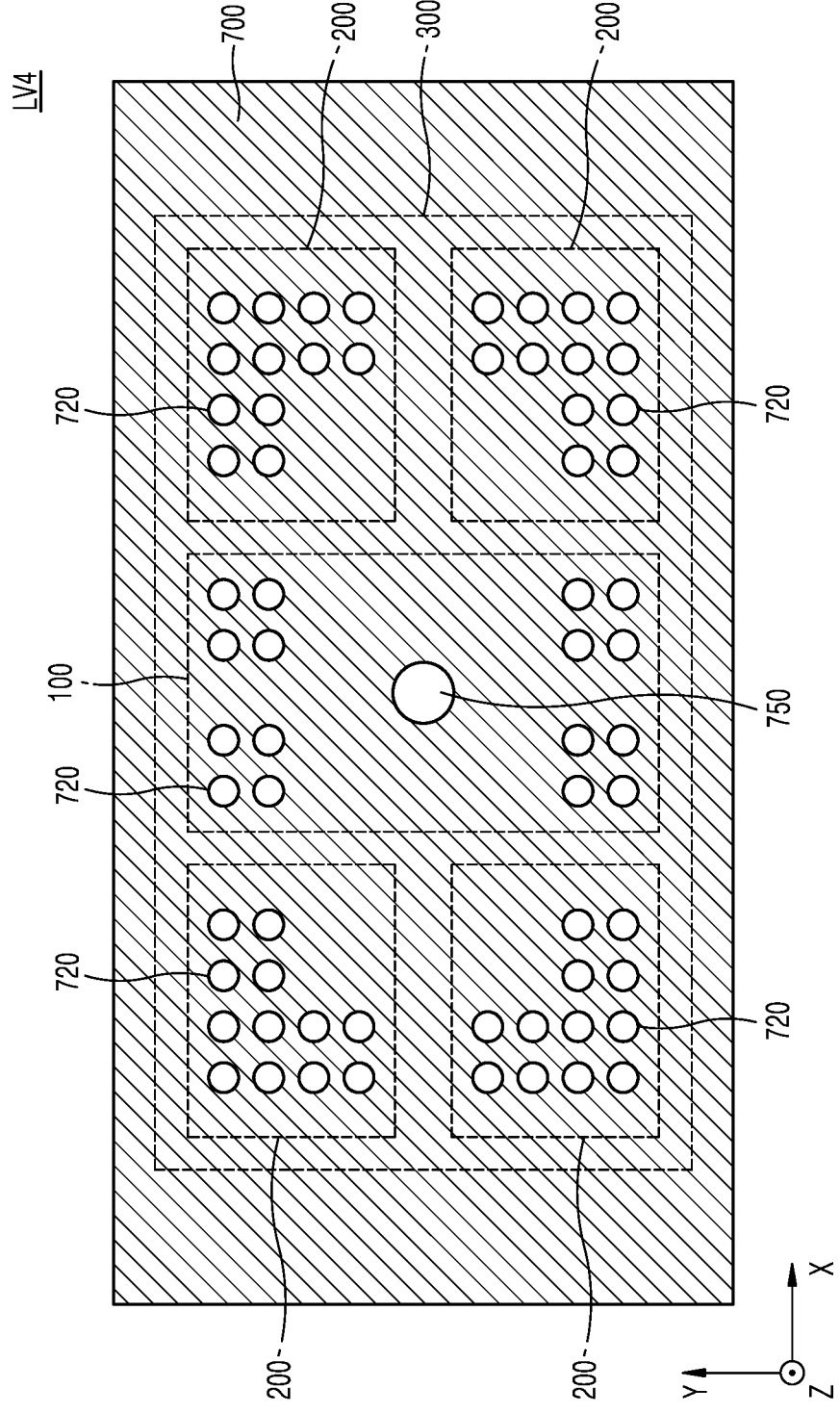

The support structure 620 may be arranged on an outer portion of an upper surface of the package substrate 500. The support structure 620 may support the heat dissipation structure 700. For example, the support structure 620 may provide a mounting groove in which the heat dissipation structure 700 may be mounted on an upper side thereof. In addition, the support structure 620 may have a through hole formed in a region overlapping the first semiconductor chip 100 and the second semiconductor chip 200. For example, the through hole of the support structure 620 may have a rectangular shape. In addition, when viewed in a plan view, a portion of the support structure 620 may cover an outer portion of the upper surface 300S of the molding layer 300. As illustrated in FIG. 1D, a portion of the support structure 620 may surround the first cooling space 810 and the second cooling spaces 820. The support structure 620 may include a metal material, such as copper (Cu), aluminum (Al), stainless steel (SUS), or the like. The support structure 620 may be spaced apart from the first and second semiconductor chips 100 and 200 and the interposer 400 to form a cavity or space VA. That is, the first and second semiconductor chips 100 and 200 and the interposer 400 may be accommodated in the cavity VA provided by the support structure 620.

The sealing ring 630 may be arranged between the moisture absorption barrier layer 610 and the support structure 620. The sealing ring 630 may include a material having excellent elastic resilience, for example, rubber. The sealing ring 630 may be arranged on an outer region of the moisture absorption barrier layer 610 covering the outer region of the upper surface 300S of the molding layer 300. The sealing ring 630 may continuously extend along the outer periphery of the upper surface 300S of the molding layer 300. The sealing ring 630 may surround the separation wall 800 when viewed in a plan view. Alternatively, the sealing ring 630 may surround the first cooling space 810 and the second cooling space 820 defined by the separation wall 800 when viewed in a plan view. The sealing ring 630 may be between the moisture absorption barrier layer 610 and the support structure 620 to remove (i.e., fill) a gap between the moisture absorption barrier layer 610 and the support structure 620. The sealing ring 630 may remove (i.e., fill) a gap between the moisture absorption barrier layer 610 and the support structure 620 to prevent the cooling fluid CT in the first cooling space 810 and the second cooling space 820 from leaking to the empty space VA of the support structure 620.

The heat dissipation structure 700 may be arranged on the support structure 620 and the separation wall 800. The heat dissipation structure 700 may be in close contact with the upper side of the separation wall 800 to cover the first cooling space 810 and the second cooling space 820. The heat dissipation structure 700 may be formed of a material having high thermal conductivity. For example, the heat dissipation structure 700 may be formed of a metal material, such as copper (Cu), aluminum (Al), stainless steel (SUS), or the like, but is not limited thereto. The heat dissipation structure 700 may provide an internal channel through which the cooling fluid CT may flow. The cooling fluid CT may be provided to the first cooling space 810 and the second cooling space 820 through an internal channel of the heat dissipation structure 700 to cool the first semiconductor chip 100 and the second semiconductor chip 200.

The heat dissipation structure 700 may include an inlet 701 through which a cooling fluid CT is introduced, an outlet 703 through which the cooling fluid CT is discharged, a cooling channel 710 extending from the inlet 701, a plurality of apertures 720 that provide fluid communication between the cooling channel 710 and the first cooling space 810 and/or between the cooling channel 710 and the second cooling space 820, and an outflow channel 750 extending between the first cooling space 810 and the outlet 703. The cooling fluid CT flows into the cooling channel 710 through the inlet 701 of the heat dissipation structure 700, flows from the cooling channel 710 through the plurality of apertures 720 to the first cooling space 810 or the second cooling space 820, flows from the second cooling space 820 to the first cooling space 810 through one or more passages in the separation wall 800, and flows from the first cooling space 810 to the outlet 703 through the outflow channel 750.

A plurality of apertures 720 may be provided adjacent (e.g., above) the first cooling space 810 and/or the second cooling space 820. The apertures 720 are formed in a lower portion of the heat dissipation structure 700, as illustrated in FIG. 1A, such that the cooling fluid flowing through the cooling channel 710 flows downward through the apertures 720 and into the first cooling space 810 and/or the second cooling space 820. For example, as illustrated in FIG. 1A, the first cooling space 810 and the second cooling space 820 may be at the third level LV3, the plurality of apertures 720 may be at a fourth level LV4 that is higher than the third level LV3, and the cooling channel 710 may be at a fifth level LV5 that is higher than the fourth level LV4.

When viewed in a plan view, some of the plurality of apertures 720 provide fluid communication between the cooling channel 710 and the first cooling space 810, and some other ones of the plurality of apertures 720 provide fluid communication between the cooling channel 710 and the second cooling space 820. In some example embodiments, the plurality of apertures 720 are provided so as to be in fluid communication only with the second cooling space 820 and may not also be in fluid communication with the first cooling space 810. The plurality of apertures 720 may have a width (or diameter) between several micrometers and hundreds of micrometers. For example, the width of each of the plurality of apertures 720 may be in a range of about 1 μm to about 500 μm.

When the semiconductor package 10 includes a plurality of second semiconductor chips 200 and a plurality of second cooling spaces 820, the number and arrangement of apertures 720 communicating with each of the plurality of second cooling spaces 820 may be substantially the same. When the number and arrangement of the apertures 720 provided above the plurality of second cooling spaces 820 are substantially the same, the flow rate of the cooling fluid CT supplied to each of the second cooling spaces 820 through the plurality of apertures 720 is uniform, thereby uniformly controlling cooling performance for the plurality of second semiconductor chips 200.

Figure 1F:
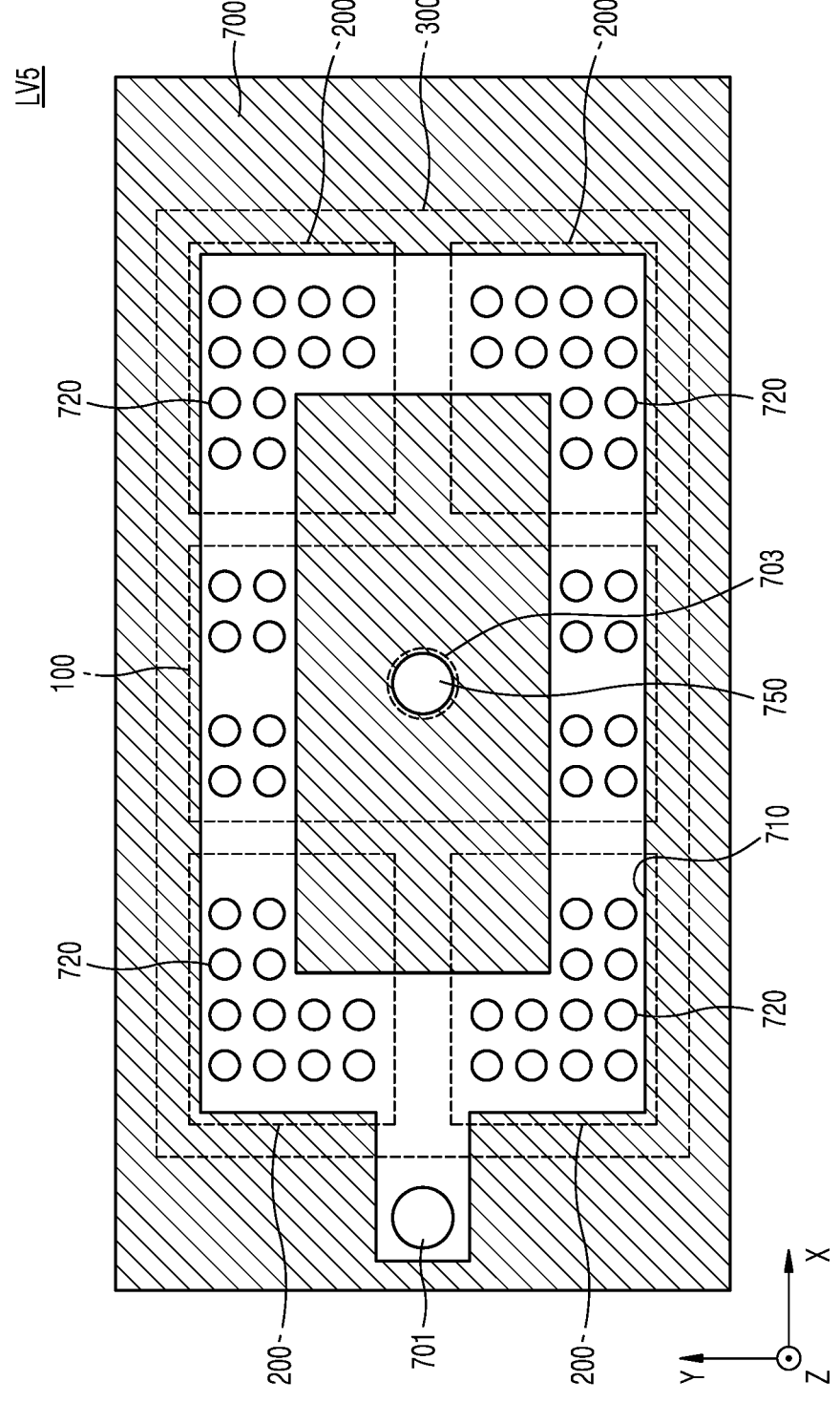

As illustrated in FIG. 1F, the cooling channel 710 may overlie all semiconductor chips included in the semiconductor package 10. For example, the cooling channel 710 may have a rectangular ring shape in a plan view and overlie the first semiconductor chip 100 and all second semiconductor chips 200 arranged around the first semiconductor chip 100.

Figure 1G:
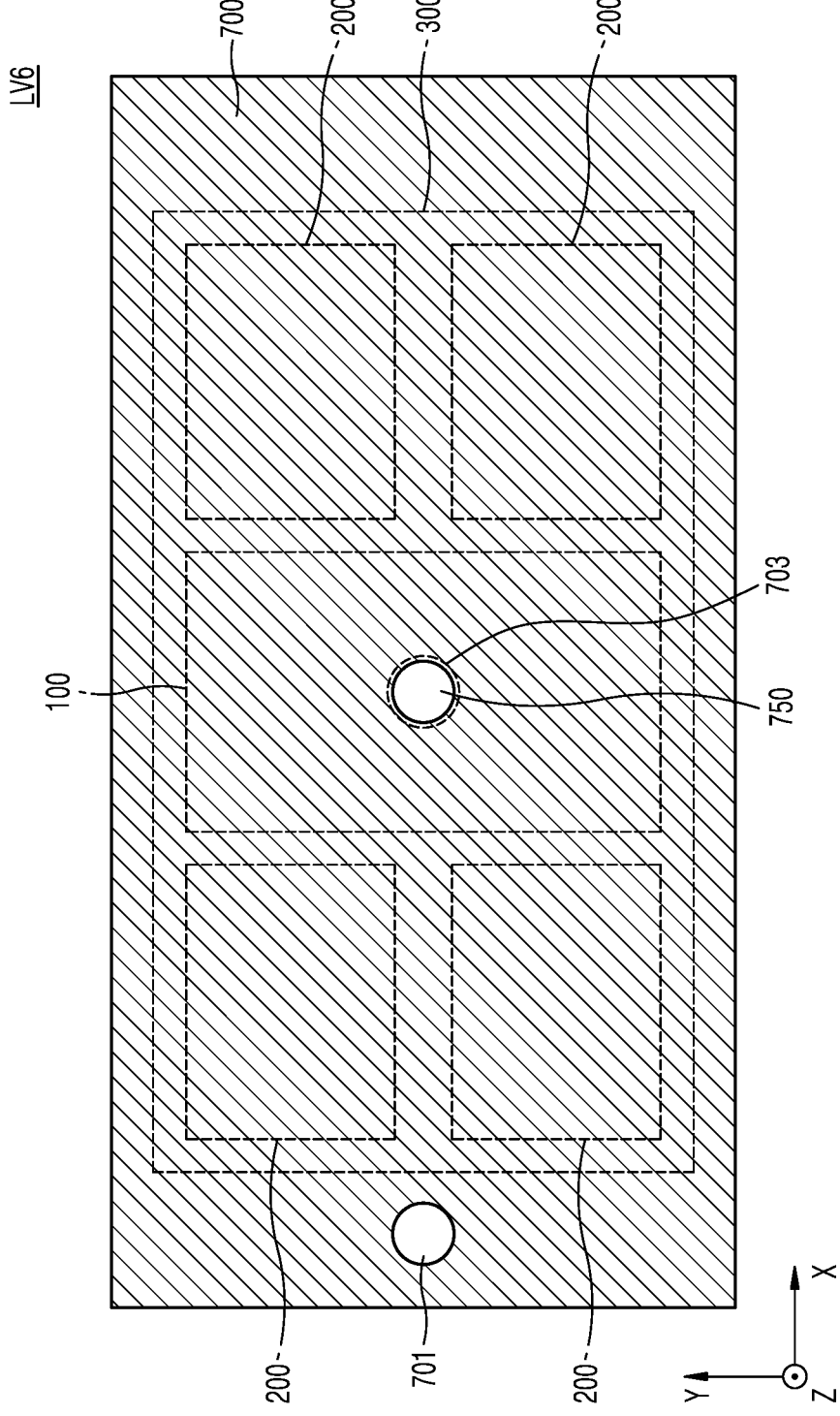

In addition, as illustrated in FIG. 1G, the outlet 703 and outflow channel 750 may be closer to the center of the upper surface 100S of the first semiconductor chip 100 than the inlet 701. For example, the outlet 703 and outflow channel 750 may overlie the first semiconductor chip 100 when viewed in a plan view, and the inlet 701 may be spaced apart from the first semiconductor chip 100 in an outward direction when viewed in a plan view. The inlet 701 may overlie the second semiconductor chips 200 or may be spaced apart from the second semiconductor chips 200 in an outward direction.

Since the first cooling space 810 related to cooling of the first semiconductor chip 100 and the second cooling space 820 related to cooling of the second semiconductor chip 200 are separated by the separation wall 800, thermal coupling between the first semiconductor chip 100 and the second semiconductor chip 200 may be reduced. For example, when the first semiconductor chip 100 includes a logic chip and the second semiconductor chip 200 includes a memory chip, the highest allowable temperature of the first semiconductor chip 100 may be greater than the highest allowable temperature of the second semiconductor chip 200. Since thermal coupling between the first semiconductor chip 100 and the second semiconductor chip 200 is reduced, performance of the second semiconductor chip 200 having a relatively low maximum allowable temperature may be reduced due to heat generation of the first semiconductor chip 100 having a relatively high maximum allowable temperature.

According to example embodiments, the cooling fluid CT may be sprayed into the first cooling space 810 and/or the second cooling spaces 820 through the plurality of apertures 720, and the velocity of the cooling fluid CT may increase as it flows through the plurality of apertures 720. Since the cooling fluid CT having an increased velocity is sprayed to the first semiconductor chip 100 and the second semiconductor chip 200, jet impingement cooling may be performed for cooling of the first semiconductor chip 100 and the second semiconductor chip 200. Accordingly, the cooling efficiency for the first semiconductor chip 100 and the second semiconductor chip 200 may be improved.

FIGS. 2A to 2F are plan views illustrating apertures 720 of a heat dissipation structure 700 according to example embodiments of the inventive concept.

Figure 2A:
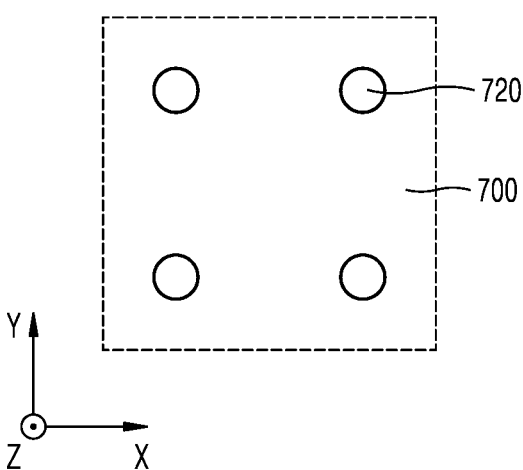
FIGS. 2A to 2F are plan views illustrating apertures in a heat dissipation structure according to example embodiments of the inventive concept.

Referring to FIG. 2A, the apertures 720 may have a circular shape.

Figure 2B:
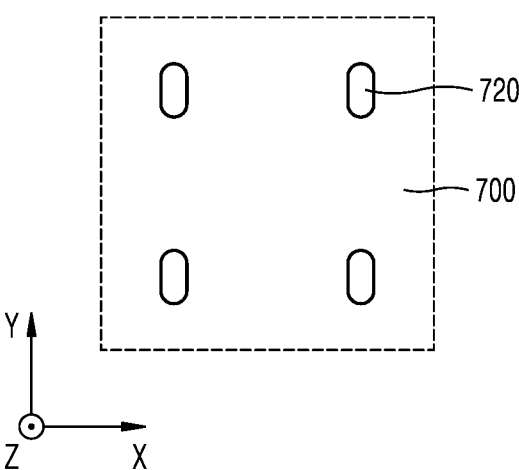

Referring to FIG. 2B, the apertures 720 may have a slit shape or an oval shape.

Figure 2C:
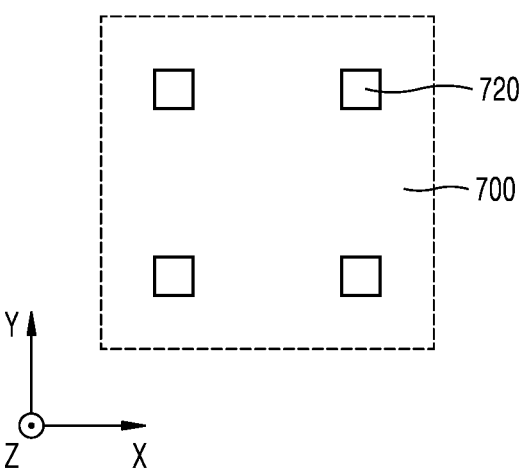

Referring to FIG. 2C, the apertures 720 may have a polygonal shape. For example, the apertures 720 may have a rectangular shape, as illustrated.

Figure 2D:
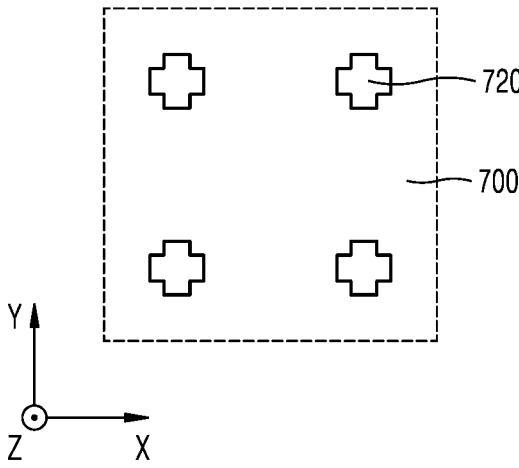

Referring to FIG. 2D, the apertures 720 may have a cross shape. For example, the apertures 720 may have a rectangular central part and protrusions from the central part in four different directions, as illustrated.

Figure 2E:
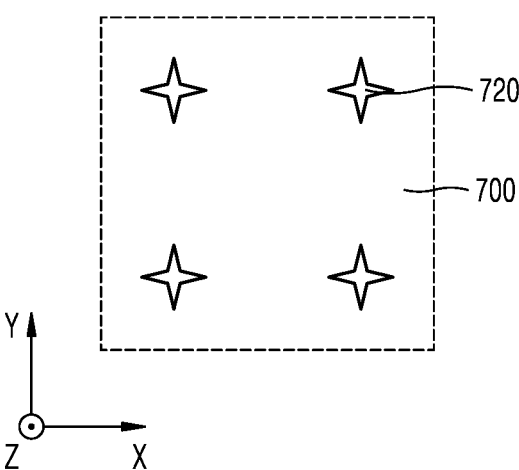

Referring to FIG. 2E, the apertures 720 may have a star shape. For example, the apertures 720 may have a central portion and protrusions from the central portion in four different directions, as illustrated. In this case, the widths of the protrusions may narrow away from the central portion.

Figure 2F:
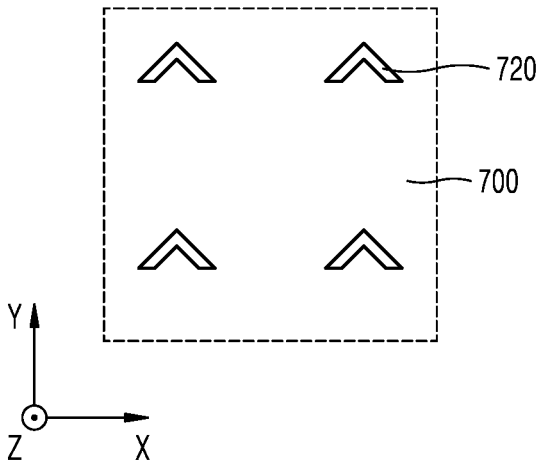

Referring to FIG. 2F, the apertures 720 may have an arrowhead shape. For example, the apertures 720 may have a shape in which two portions linearly extending in different directions meet each other at one point, as illustrated.

FIGS. 3A to 3D are cross-sectional views schematically illustrating a cross-section of a separation wall 800 according to example embodiments of the inventive concept.

Figure 3A:
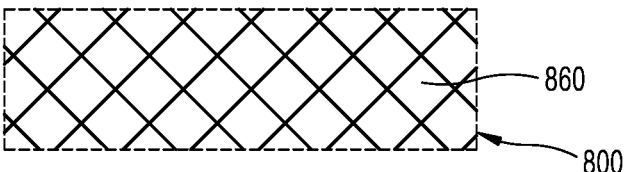
FIGS. 3A to 3D are cross-sectional views schematically illustrating a cross-section of a separation wall according to example embodiments of the inventive concept.

Referring to FIG. 3A, the separation wall 800 may have a mesh structure. The cooling fluid may be transmitted through passages 860 of the separation wall 800 having a mesh structure.

Figure 3B:
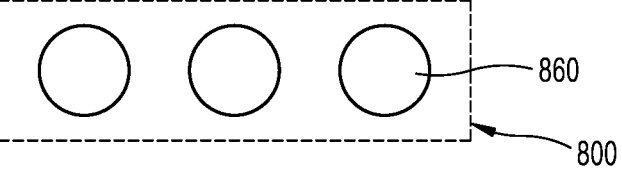

Referring to FIG. 3B, the passages 860 of the separation wall 800 may have a circular shape and have a constant diameter. Alternatively, the passages 860 of the separation wall 800 may have a polygonal shape, such as a rectangular shape.

Figure 3C:
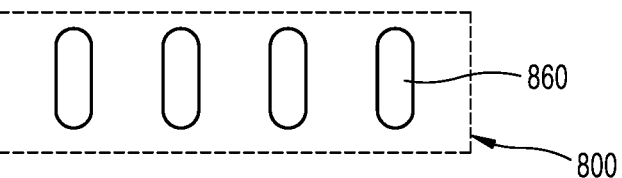

Referring to FIG. 3C, the passages 860 of the separation wall 800 may have an oval shape or a slit shape.

Figure 3D:
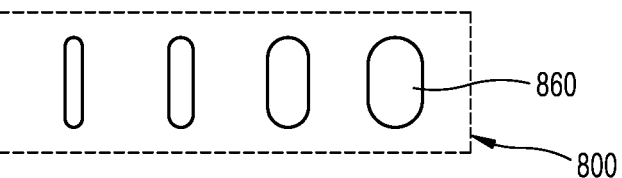

Referring to FIG. 3D, the passages 860 of the separation wall 800 may have a slit shape, but the sizes thereof may be different from each other, as illustrated.

Figure 4A:
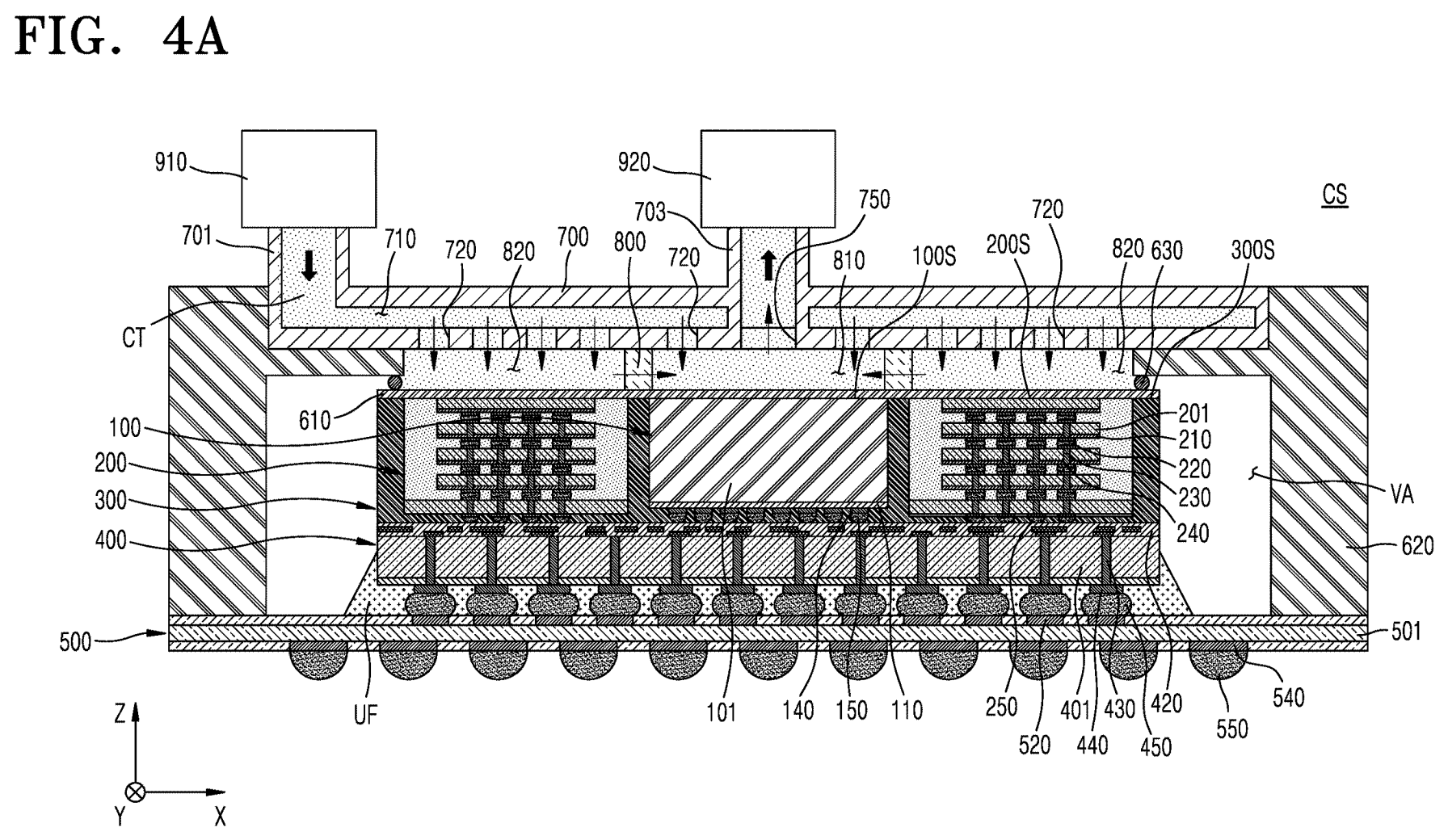
Figure 4B:
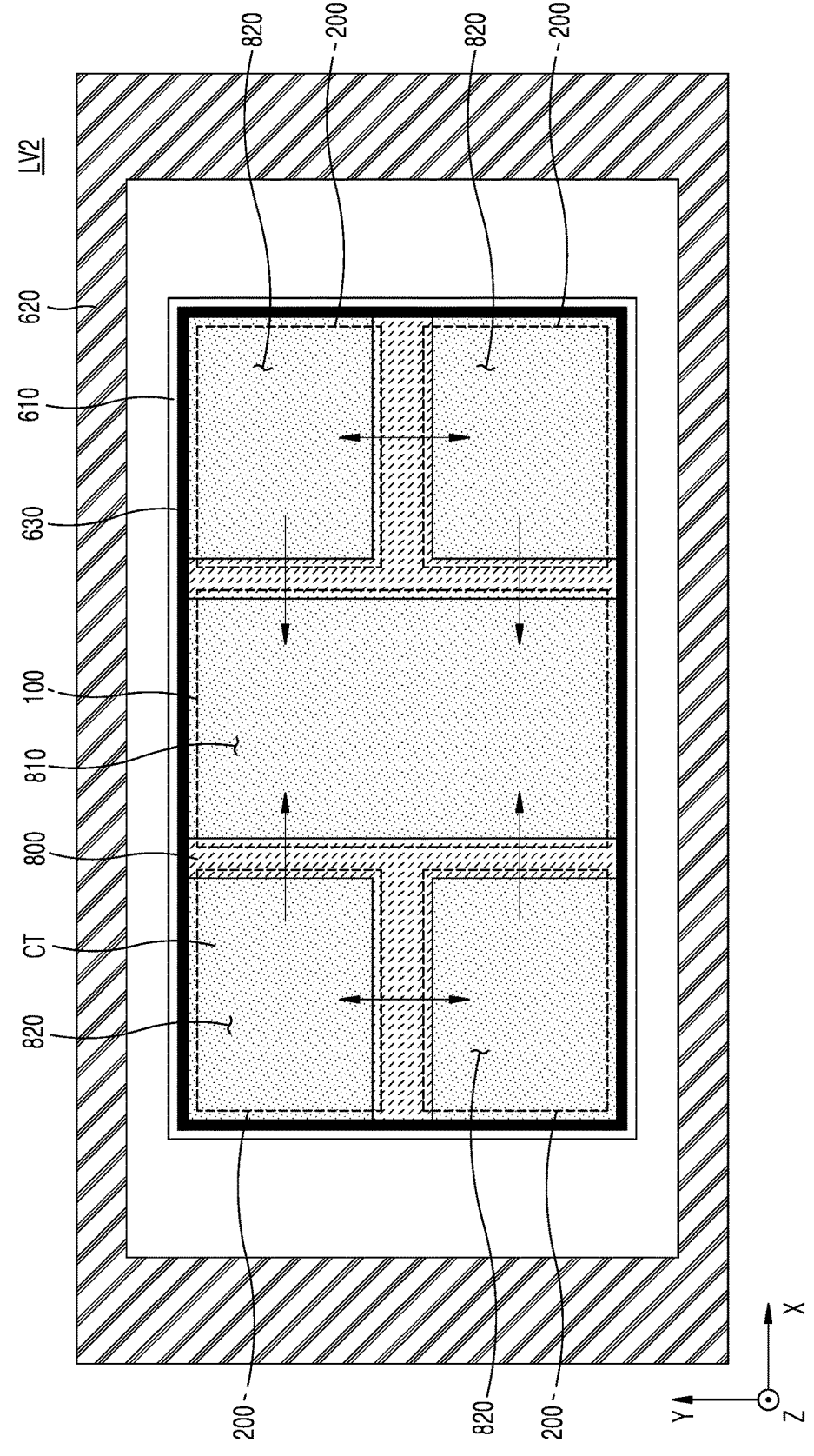
FIG. 4B is a plan view illustrating the cooling system of FIG. 4A.

FIG. 4A is a cross-sectional view illustrating a cooling system CS of a semiconductor package 10 according to example embodiments of the inventive concept. FIG. 4B is a plan view of the cooling system CS of FIG. 4A. FIG. 4B illustrates a cut surface of the cooling system CS along a level corresponding to the LV2 level of FIG. 1A.

Referring to FIGS. 4A and 4B together with FIG. 1A, the cooling system CS is provided on the semiconductor package 10 and may include a cooling fluid CT, a water cooling pump 910, and a heat dissipater 920.

The cooling fluid CT may be deionized water or a mixture of deionized water and one or more additives. The additives may include, for example, a surfactant, a corrosion inhibitor, antifreeze, and thermally conductive nanoparticles.

The water cooling pump 910 may be connected to the inlet 701 of the heat dissipation structure 700, and the heat dissipater 920 may be connected to the outlet 703 of the heat dissipation structure 700. The water cooling pump 910 and the heat dissipater 920 may be respectively connected to the inlet 701 and the outlet 703 of the heat dissipation structure 700 through a piping system.

The operation process of the cooling system CS will be described in detail below. In FIGS. 4A and 4B, arrows schematically indicate flow paths of the cooling fluid CT.

First, the cooling fluid CT provided from the water cooling pump 910 flows into the inlet 701 of the heat dissipation structure 700. Next, the cooling fluid CT flows along the cooling channel 710 of the heat dissipation structure 700 and flows to the first cooling space 810 and the second cooling space 820 through the plurality of apertures 720. The cooling fluid CT in the second cooling space 820 flows to the first cooling space 810 through the separation wall 800 configured to transmit the cooling fluid CT. Next, the cooling fluid CT flows from the first cooling space 810 to the outlet 703 through the outflow channel 750 and is collected by the heat dissipater 920 connected to the outlet 703.

In general, the internal temperature of the semiconductor package 10 may increase while the semiconductor package 10 is operating. In this case, the internal temperature of the semiconductor package 10 may be higher than the temperature of the heat dissipation structure 700 and the temperature of the cooling fluid CT. Accordingly, when the cooling fluid CT is provided to the first cooling space 810 and the second cooling space 820, heat exchange may occur between each of the first and second semiconductor chips 100 and 200 and the cooling fluid CT. As a result of the heat exchange, the internal temperature of the semiconductor package 10 may be lowered, and the temperature of the cooling fluid CT may be increased. The cooling fluid CT having an increased temperature may be cooled by the heat dissipater 920 before being used again for cooling the semiconductor package 10.

Demand for portable devices has been increasing rapidly in the electronic products market, and for this reason, miniaturization and lighter weight electronic components mounted on these electronic products may be required. To accomplish miniaturization and weight reduction, semiconductor packages are increasingly required to process high-capacity data within a smaller package volume. Thus, there is a need for high integration and single packaging of semiconductor chips mounted in semiconductor packages. However, problems due to overheating and thermal fatigue may become significant because of the structure of conventional semiconductor packages.

The semiconductor package 10 according to the example embodiments is designed to connect a water-cooled cooling device to the upper part of the heat dissipation structure 700. Accordingly, cooling of the first and second semiconductor chips 100 and 200 may be realized by direct cooling using the cooling fluid CT, and the moisture absorption barrier layer 610 and the separation wall 800 are also formed to cover the upper surface 300S of the molding layer 300, to thereby ensure excellent waterproof performance.

In addition, in the semiconductor package 10 according to example embodiments, a cooling fluid CT having an increased velocity while passing through the plurality of apertures 720 may be sprayed on the first semiconductor chip 100 and the second semiconductor chip 200 to perform jet impingement cooling on the first semiconductor chip 100 and the second semiconductor chip 200, thereby improving cooling efficiency of the first semiconductor chip 100 and the second semiconductor chip 200. Accordingly, a failure, such as a malfunction of the first and second semiconductor chips 100 and 200, may be prevented from deteriorating product reliability due to overheating.

Figure 5A:
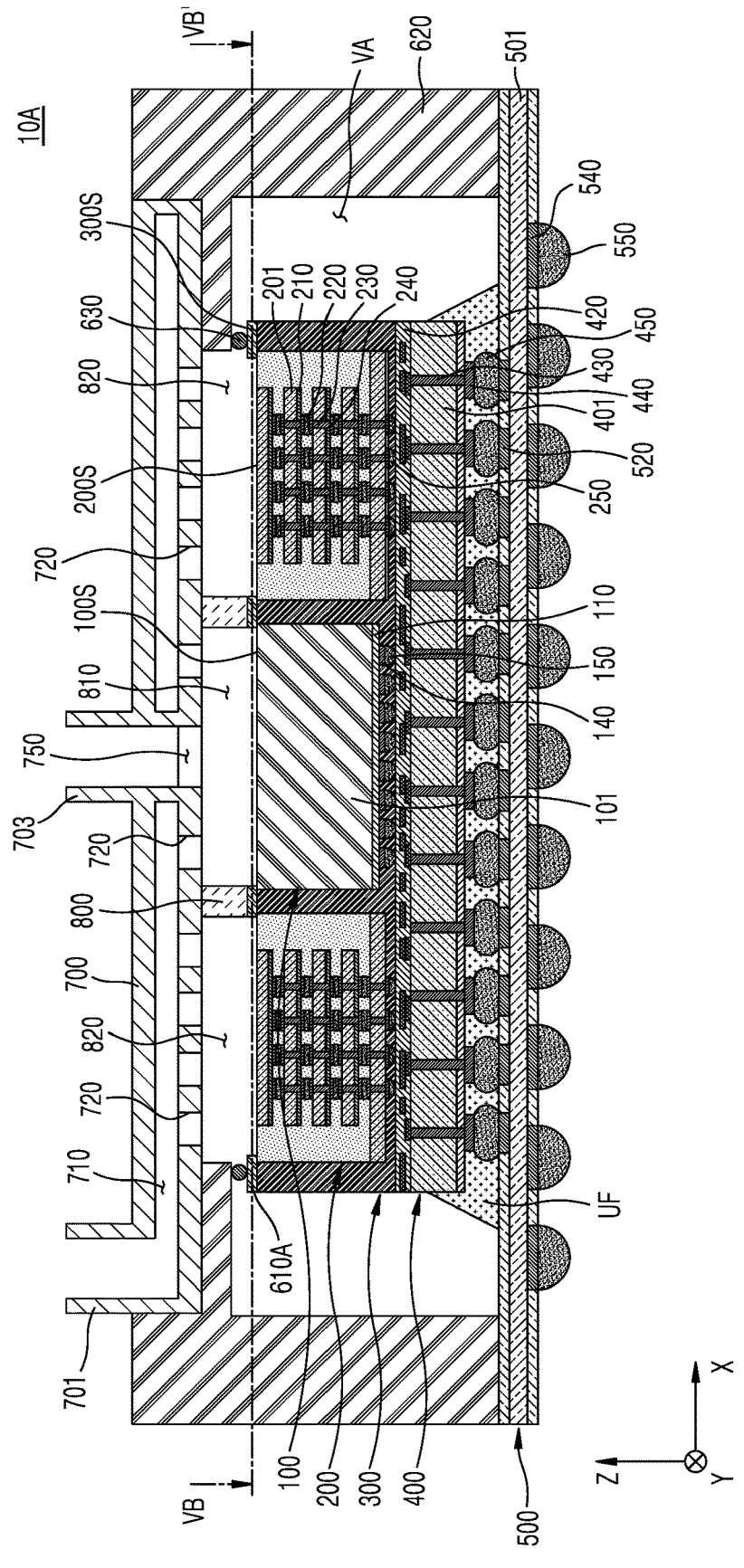
FIG. 5A is a cross-sectional view illustrating a semiconductor package according to example embodiments of the inventive concept.
Figure 5B:
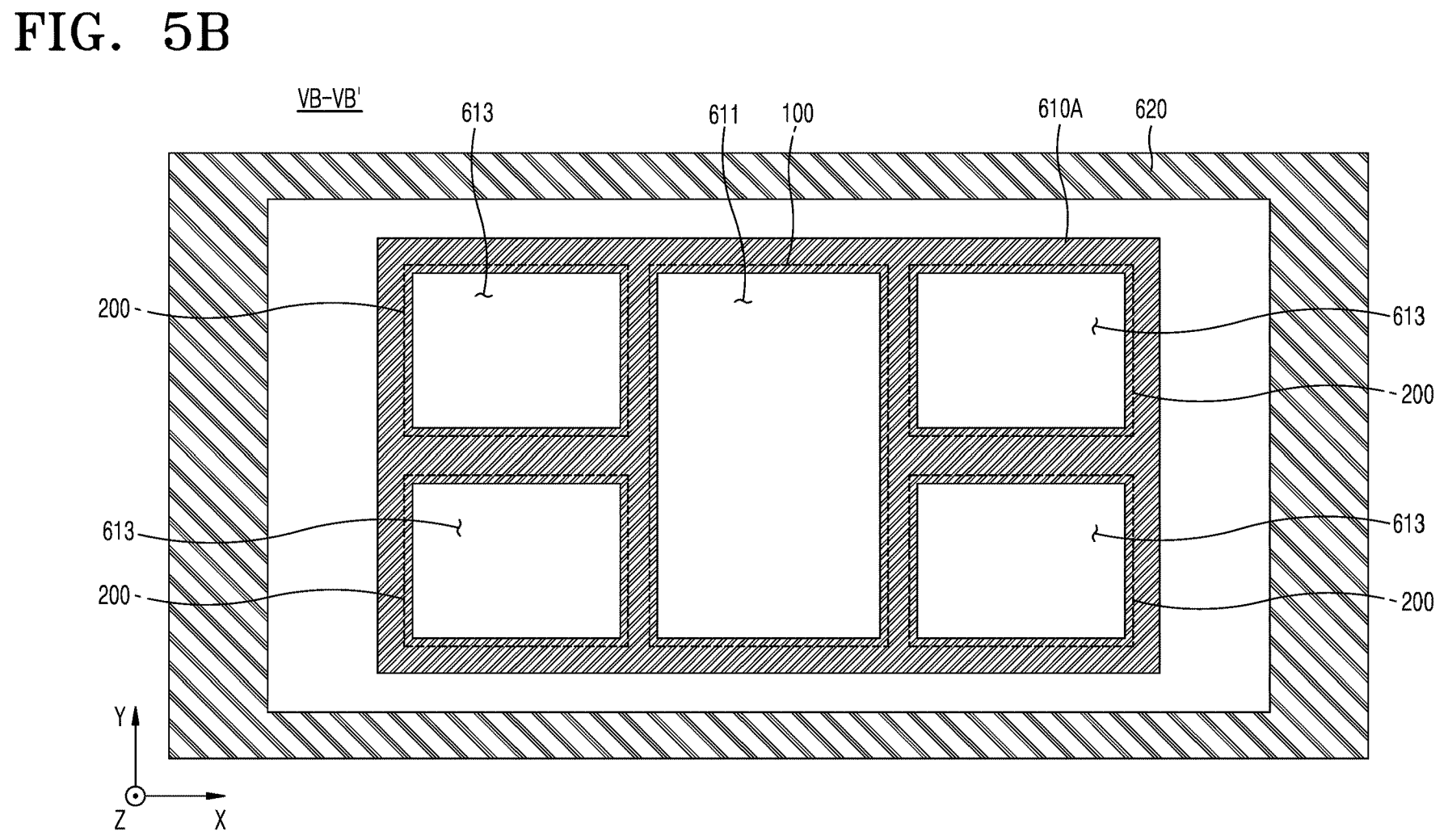

FIG. 5A is a cross-sectional view illustrating a semiconductor package 10A according to example embodiments of the inventive concept. FIG. 5B is a cross-sectional view taken along line VB-VB' of FIG. 5A. Hereinafter, the semiconductor package 10A illustrated in FIGS. 5A and 5B will be described based on the difference from the semiconductor package 10 described above with reference to FIGS. 1A to 1G.

Referring to FIGS. 5A and 5B, the barrier layer 610A may cover an upper surface 300S of the molding layer 300, but may not cover at least a part of the upper surface 100S of the first semiconductor chip 100 and at least a part of the upper surface 200S of the second semiconductor chip 200. The barrier layer 610A may include a first opening 611 for exposing at least a part of the upper surface 100S of the first semiconductor chip 100 and a second opening 613 for exposing at least a part of the second semiconductor chip 200, as illustrated in FIG. 5B. The first cooling space 810 and the upper surface 100S of the first semiconductor chip 100 may directly communicate with each other through the first opening 611 of the barrier layer 610A. The second cooling space 820 and the upper surface 200S of the second semiconductor chip 200 may directly communicate with each other through the second opening 613 of the barrier layer 610A.

Figure 6A:
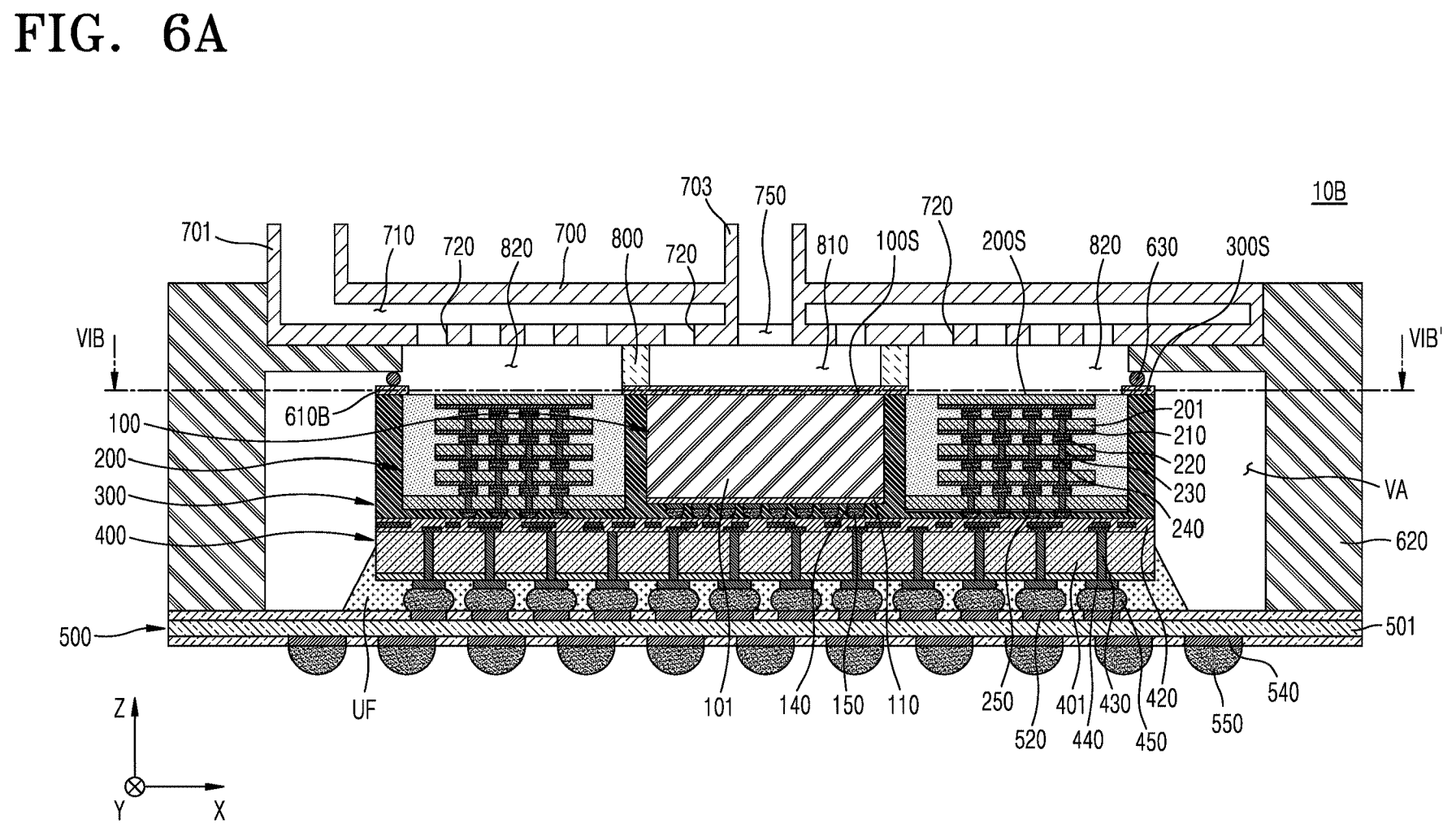
Figure 6B:
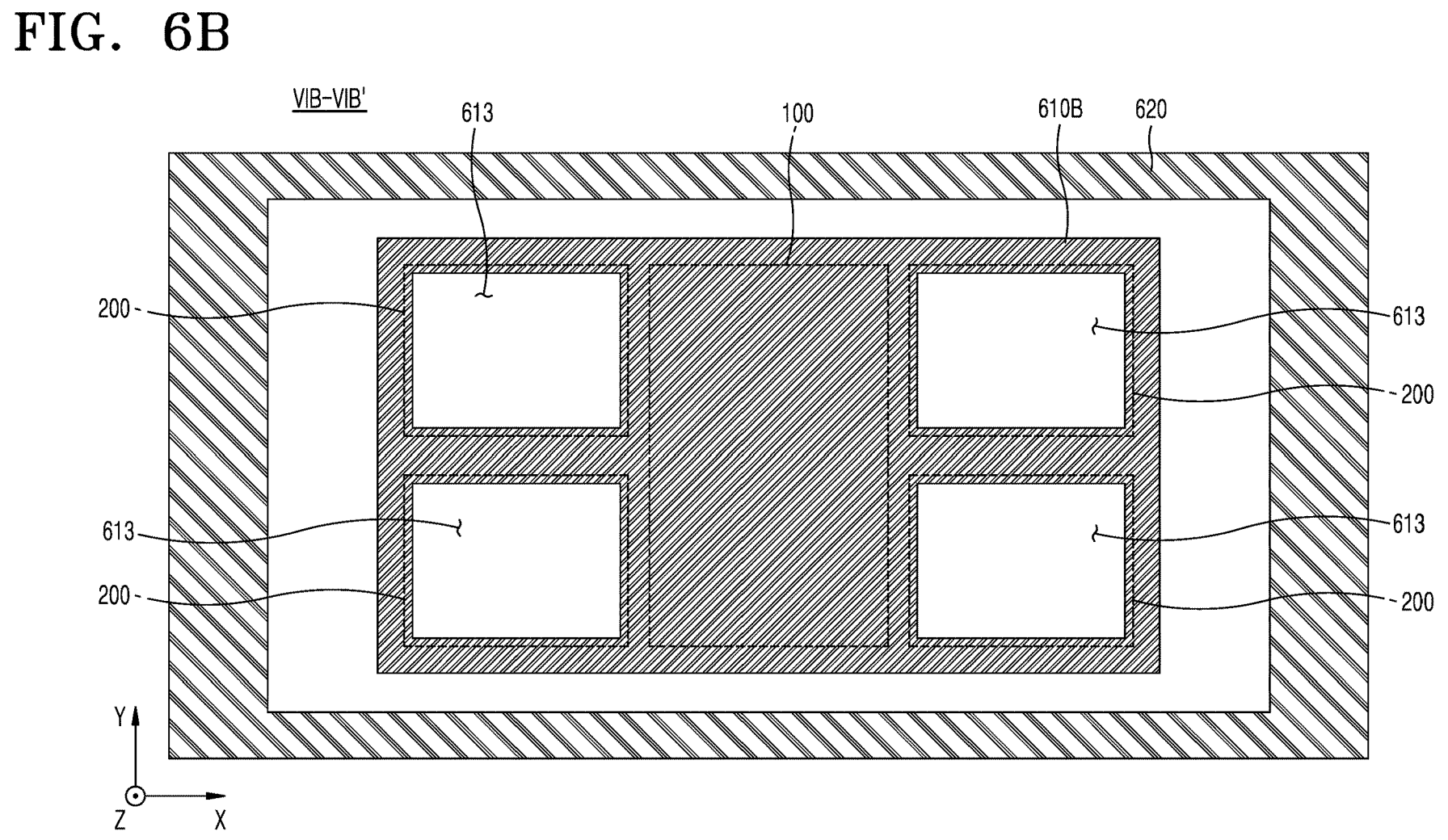

FIG. 6A is a cross-sectional view illustrating a semiconductor package 10B according to example embodiments of the inventive concept. FIG. 6B is a cross-sectional view taken along line VIB-VIB' of FIG. 6A. Hereinafter, the semiconductor package 10B illustrated in FIGS. 6A and 6B will be described based on the difference from the semiconductor package 10 described above with reference to FIGS. 1A to 1G.

Referring to FIGS. 6A and 6B, the barrier layer 610B may cover the upper surface 300S of the molding layer 300 and the upper surface 100S of the first semiconductor chip 100, but may not cover at least a part of the upper surface 200S of the second semiconductor chip 200. The barrier layer 610B may include a second opening 613 for exposing at least a portion of the second semiconductor chip 200, as illustrated in FIG. 6B. The second cooling space 820 and the top surface 200S of the second semiconductor chip 200 may directly communicate with each other through the second opening 613 of the barrier layer 610B.

Figure 7A:
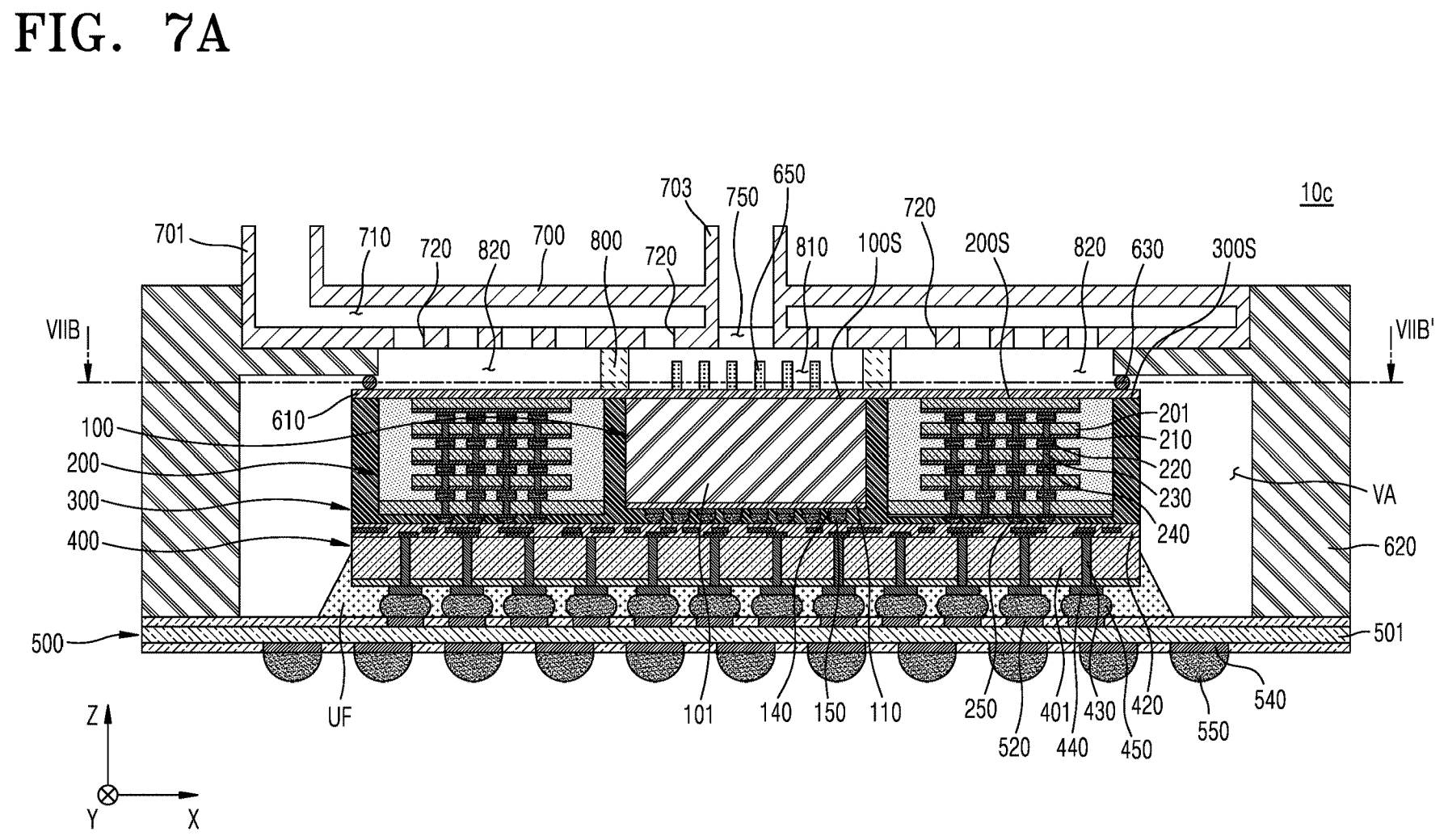
Figure 7B:
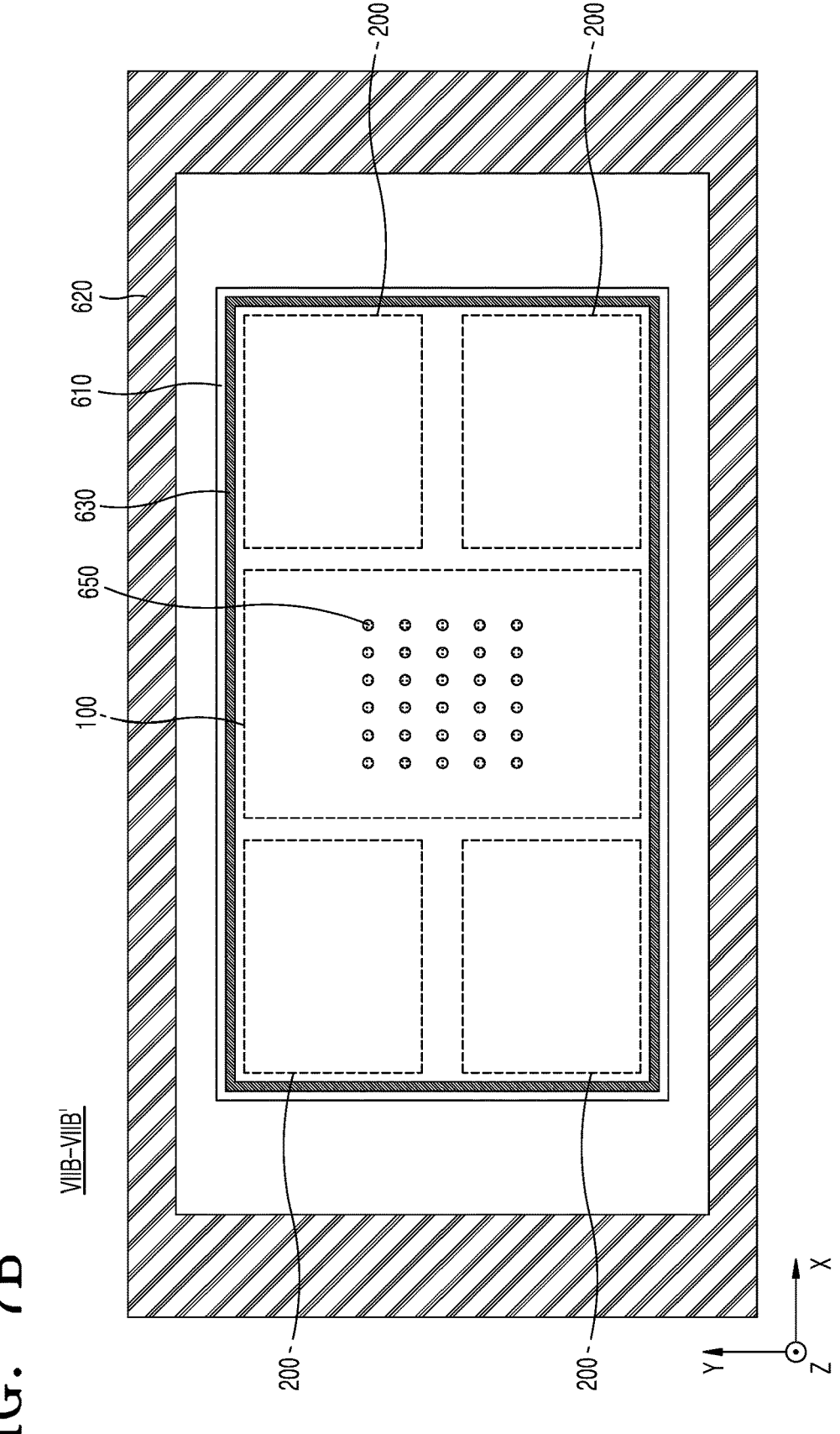
FIG. 7B is a cross-sectional view taken along line VIIB-VIIB' of FIG. 7A.

FIG. 7A is a cross-sectional view illustrating a semiconductor package 10C according to example embodiments of the inventive concept. FIG. 7B is a cross-sectional view taken along line VIIB-VIIB' of FIG. 7A. Hereinafter, the semiconductor package 10C illustrated in FIGS. 7A and 7B will be described based on the difference from the semiconductor package 10 described above with reference to FIGS. 1A to 1G.

Referring to FIGS. 7A and 7B, the semiconductor package 10C may include a plurality of structures 650 provided in the first cooling space 810. The illustrated structures 650 have a "pillar" or "column" shape, and extend upward from the moisture absorption barrier layer 610. The illustrated plurality of structures 650 extend upward from the moisture absorption barrier layer 610 in the form of a two-dimensional array. The plurality of structures 650 are configured to induce vortex generation (i.e., turbulence) in the flow of the cooling fluid (CT of FIG. 4A) in the first cooling space 810, thereby increasing the heat exchange efficiency between the cooling fluid CT and the first semiconductor chip 100.

The plurality of structures 650 are arranged so as not to be positioned directly beneath any of the apertures 720 of the heat dissipation structure 700, thereby preventing the plurality of structures 650 from being damaged due to the cooling fluid CT flowing at high velocity through the apertures 720.

In example embodiments, the plurality of structures 650 may be formed of metal. For example, the plurality of structures 650 may be formed using an electroplating process using, as a seed, the moisture absorption barrier layer 610 including a metal. The structures 650 may have various configurations and shapes and are not limited to the illustrated configuration and shape.

FIGS. 8 to 11 are cross-sectional views illustrating heat dissipation structures 700A, 700B, 700C, and 700D according to example embodiments of the inventive concept, respectively. FIGS. 8 to 11 respectively show cut surfaces of heat dissipation structures 700A, 700B, 700C, and 700D cut along the levels corresponding to the LV5 level of FIG. 1A. Hereinafter, the heat dissipation structures 700A, 700B, 700C, and 700D illustrated in FIGS. 8 to 11 will be described based on a difference of the heat dissipation structure 700 of the semiconductor package 10 described above with reference to FIGS. 1A to 1G.

Figure 8:
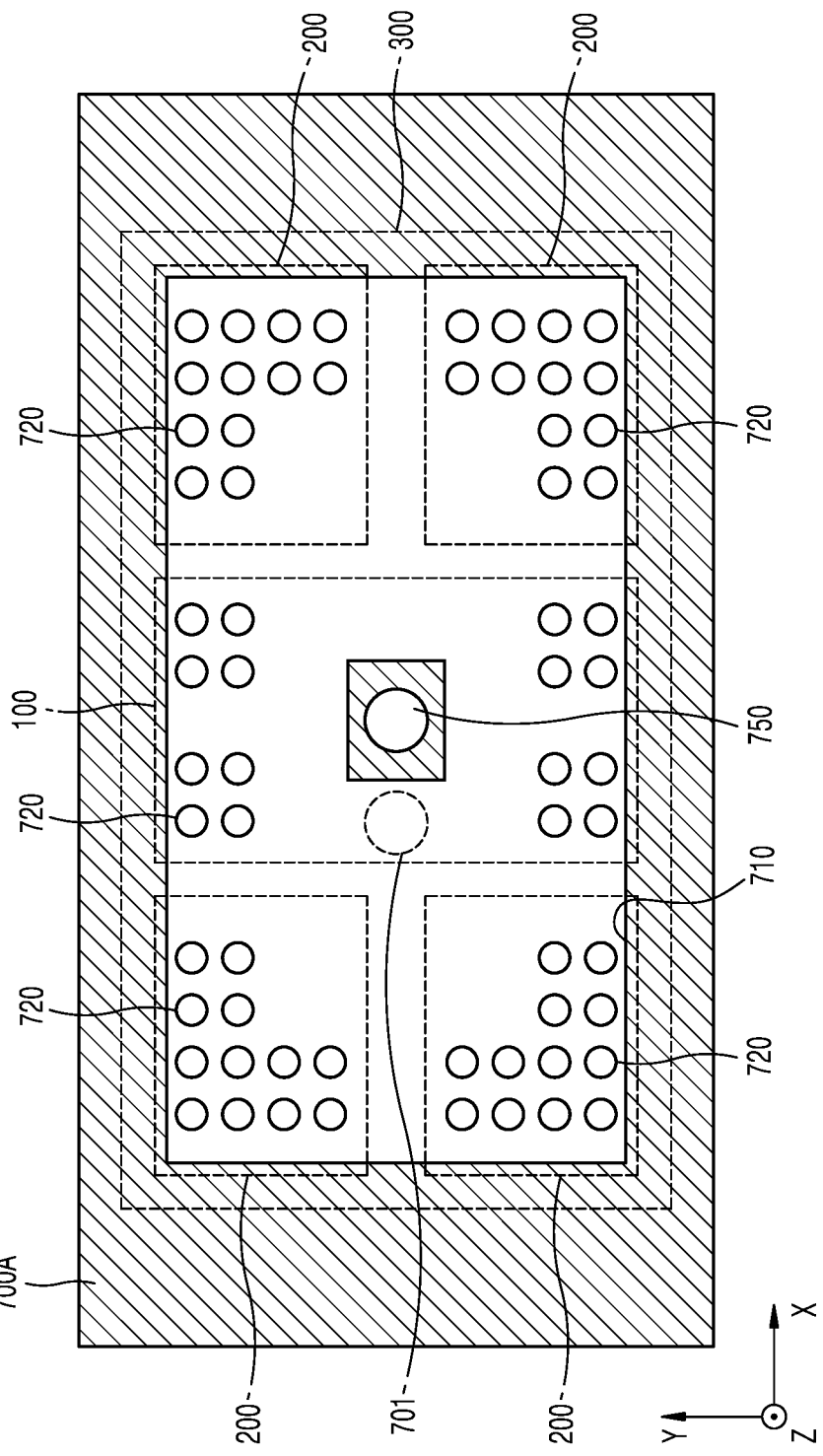

Referring to FIG. 8 together with FIG. 1A, in the heat dissipation structure 700A, the inlet 701 and the outlet 703 may be provided on the upper surface 100S of the first semiconductor chip 100 in a plan view. In this case, the cooling fluid (CT in FIG. 4A) is first supplied to the region above the first semiconductor chip 100, and then moves to the region above the second semiconductor chip 200 along the cooling channel 710.

Figure 9:
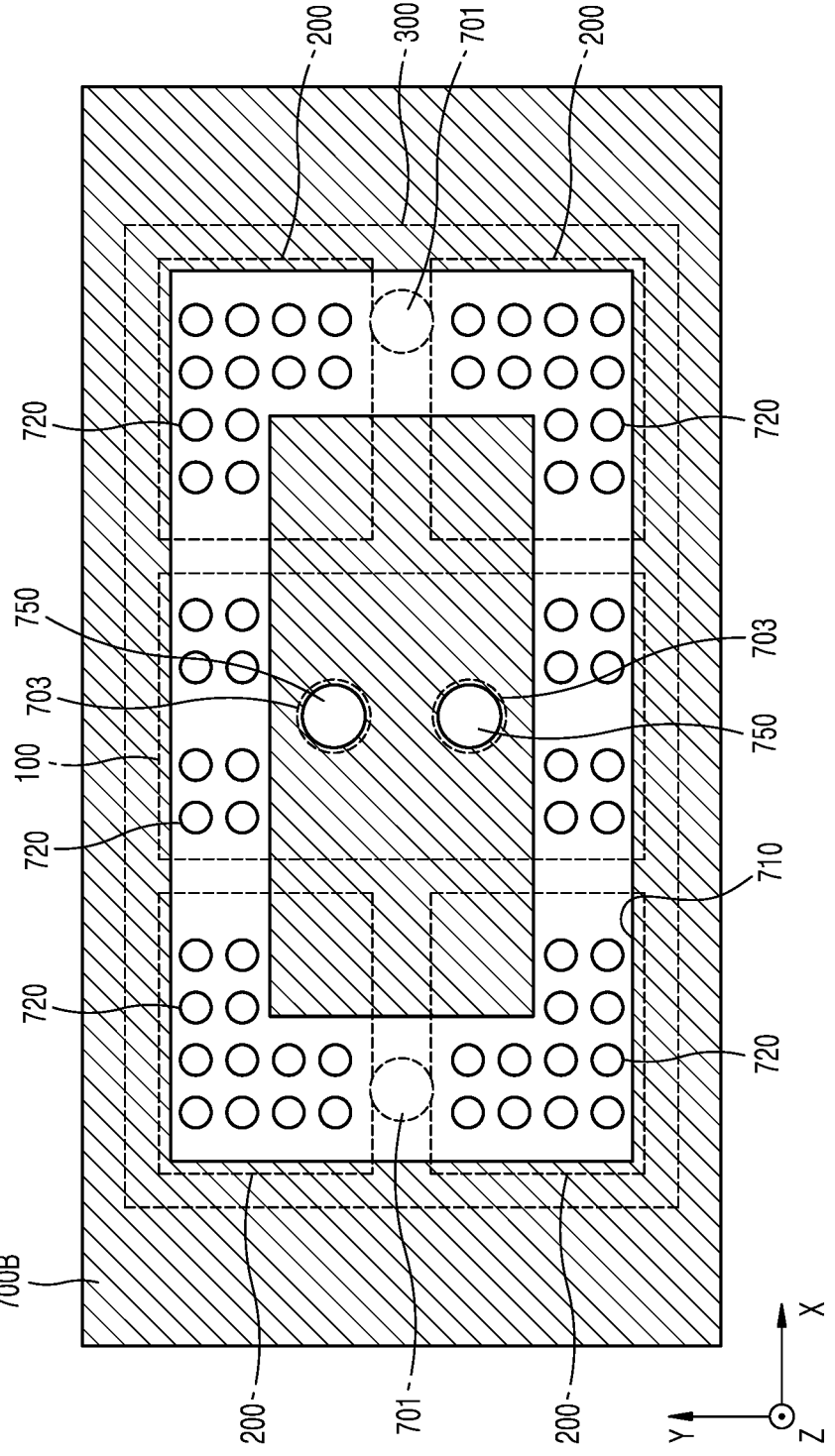

Referring to FIG. 9 together with FIG. 1A, the heat dissipation structure 700B may include a plurality of inlets 701. The plurality of inlets 701 may be positioned so as not to overlie the first semiconductor chip 100 in a plan view. The plurality of inlets 701 may be arranged above the second semiconductor chip 200 or spaced apart from the second semiconductor chip 200 in an outward direction. The cooling fluid (CT in FIG. 4A) may be provided to the cooling channel 710 through each of the plurality of inlets 701.

In addition, the heat dissipation structure 700B may include a plurality of outlets 703. The plurality of outlets 703 may overlie the first semiconductor chip 100 in a plan view. The plurality of outlets 703 may be connected to the second cooling space 820 through different outflow channels 750, and the cooling fluid CT of the second cooling space 820 may be discharged to the outside of the heat dissipation structure 700B through the plurality of outlets 703.

Figure 10:
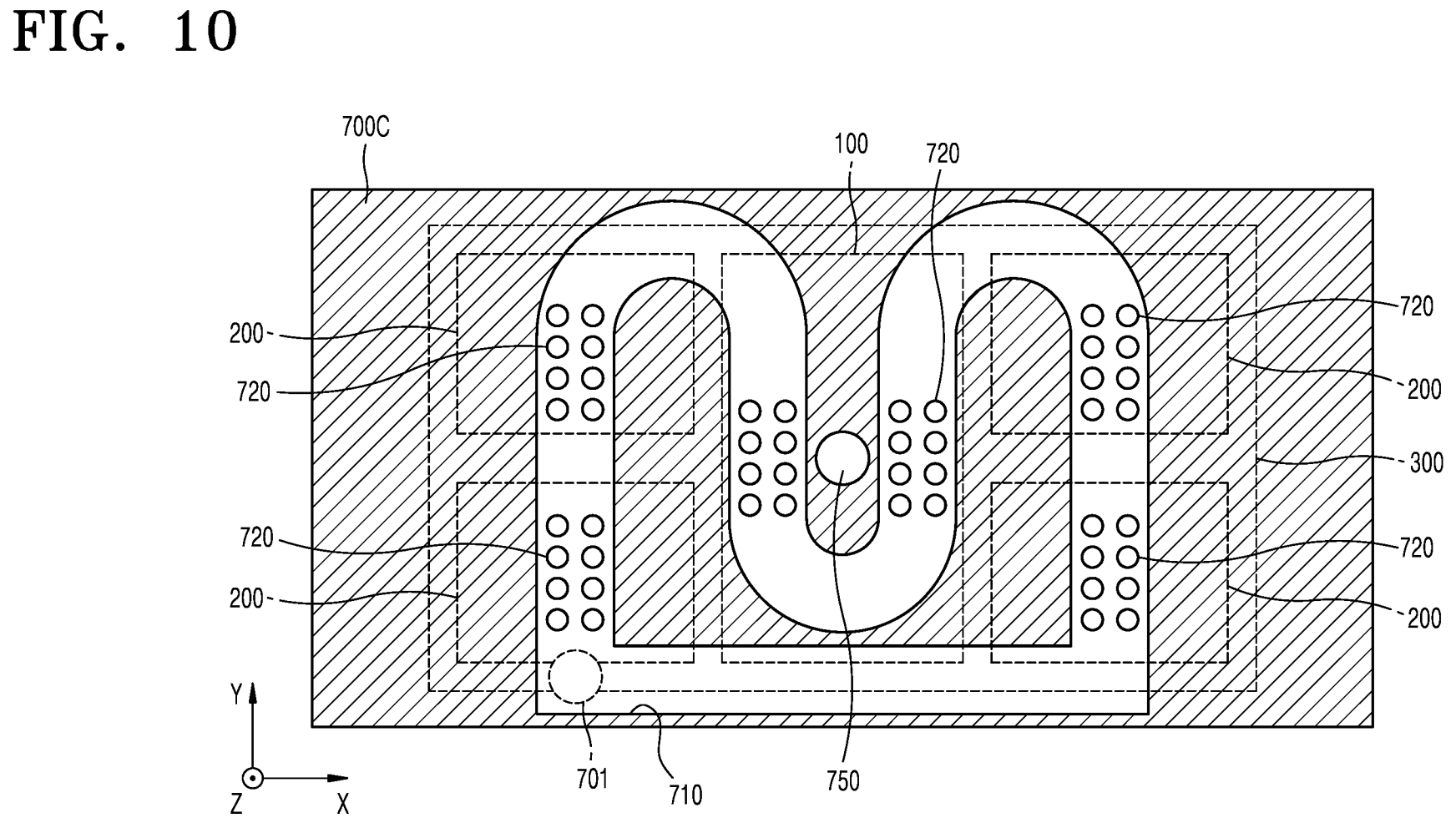

Referring to FIG. 10 together with FIG. 1A, the cooling channel 710 of the heat dissipating structure 700C may be a single channel that extends in a serpentine manner in a plan view. For example, the cooling channel 710 may include: a first sub-channel linearly extending in the second horizontal direction (e.g., Y direction) above the second semiconductor chips 200 provided on one side of the first semiconductor chip 100 (e.g., the left side of the first semiconductor chip 100); a second sub-channel linearly extending in the second horizontal direction (e.g., the Y direction) above the first semiconductor chip 100; a third sub-channel linearly extending in the second horizontal direction (e.g., in the Y direction) above the first semiconductor chip 100 and spaced apart from the second sub-channel in the first horizontal direction (e.g., in the X direction); a fourth sub-channel linearly extending in the second horizontal direction (e.g., Y direction) above the second semiconductor chips 200 provided on the other side of the first semiconductor chip 100 (e.g., the right side of the first semiconductor chip 100); and connection channels for sequentially connecting the first to fourth sub-channels. Here, the first to fourth sub-channels may be spaced apart from each other in a first horizontal direction (e.g., X direction).

Figure 11:
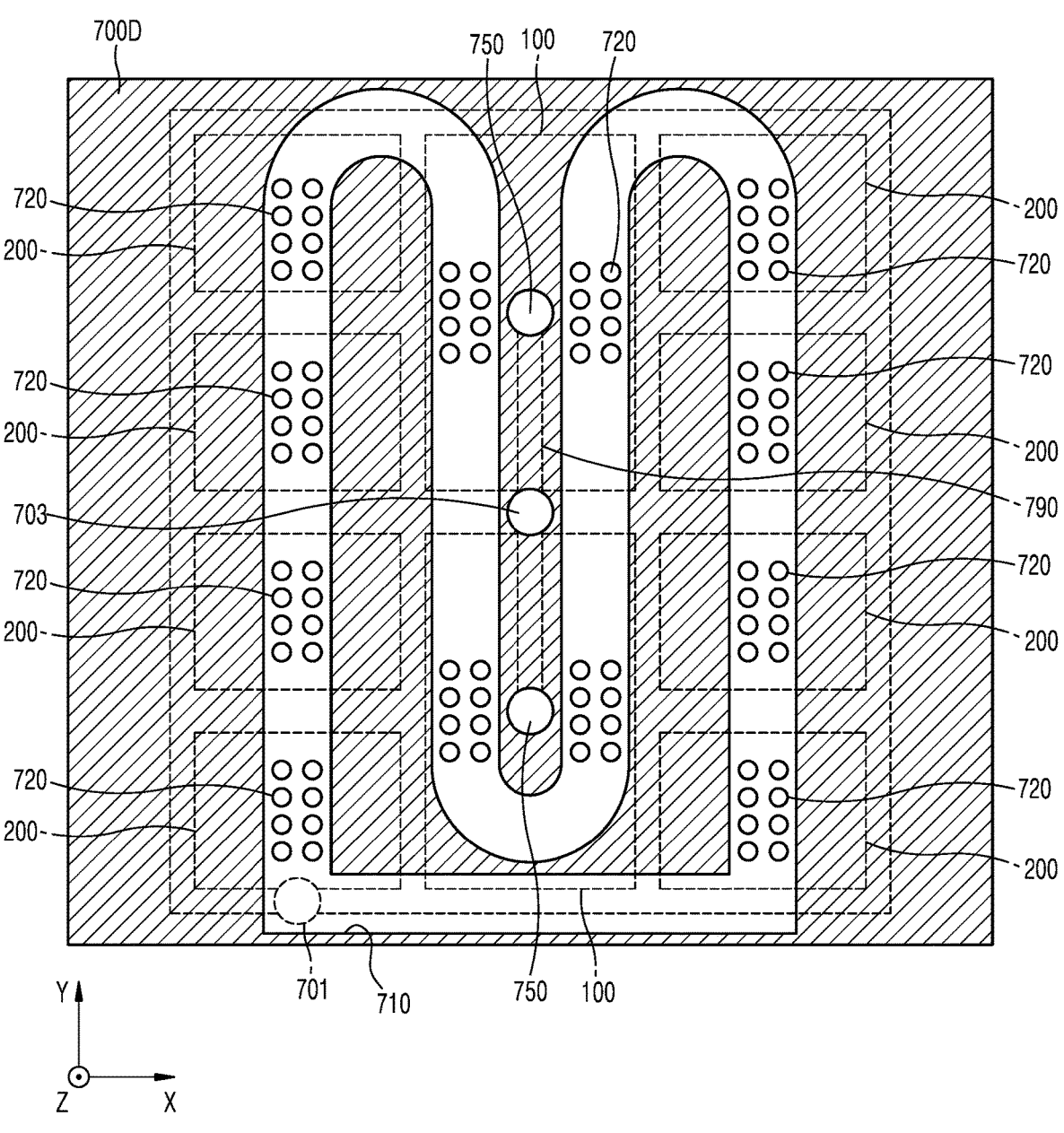

Referring to FIG. 11 together with FIG. 1A, the semiconductor package 10 may include a plurality of first semiconductor chips 100 and a plurality of second semiconductor chips 200. For example, in the semiconductor package 10, two first semiconductor chips 100 may be arranged in a second horizontal direction (e.g., Y direction), and two second semiconductor chips 200 may be arranged at one side and the other side of each of the two first semiconductor chips 100.

When the semiconductor package 10 includes a plurality of first semiconductor chips 100, the first cooling spaces 810 may be separated or partitioned from each other by the separation wall 800, and the first cooling spaces 810 may be connected to the outlet 703 through different outflow channels 750 and channels 790. That is, the cooling fluid (CT in FIG. 4A) may flow to the outlet 703 through the first cooling spaces 810 and the outflow channels 750 and then may be discharged to the outside of a heat dissipation structure 700D.

The cooling channel 710 of the heat dissipation structure 700D may extend in a serpentine configuration above all semiconductor chips provided in the semiconductor package 10. For example, the cooling channel 710 may include: a first sub-channel linearly extending in the second horizontal direction (e.g., Y direction) above the second semiconductor chips 200 provided on one side of each of the first semiconductor chips 100 (e.g., the left side of each of the first semiconductor chips 100); a second sub-channel linearly extending in the second horizontal direction (e.g., the Y direction) above the first semiconductor chips 100; a third sub-channel linearly extending in the second horizontal direction (e.g., in the Y direction) above the first semiconductor chips 100 and spaced apart from the second sub-channel in the first horizontal direction (e.g., in the X direction); a fourth sub-channel linearly extending in the second horizontal direction (e.g., Y direction) above the second semiconductor chips 200 provided on the other side of each of the first semiconductor chips 100 (e.g., the right side of each of the first semiconductor chips 100); and connection channels for sequentially connecting the first to fourth sub-channels. Here, the first to fourth sub-channels may be spaced apart from each other in a first horizontal direction (e.g., X direction).

FIGS. 12A to 12G are cross-sectional views illustrating a method of manufacturing a semiconductor package 10 according to example embodiments. Hereinafter, referring to FIGS. 12A to 12G, a method of manufacturing the semiconductor package 10 described with reference to FIGS. 1A to 1G and a method of configuring the cooling system CS of the semiconductor package 10 will be described.

Figure 12A:
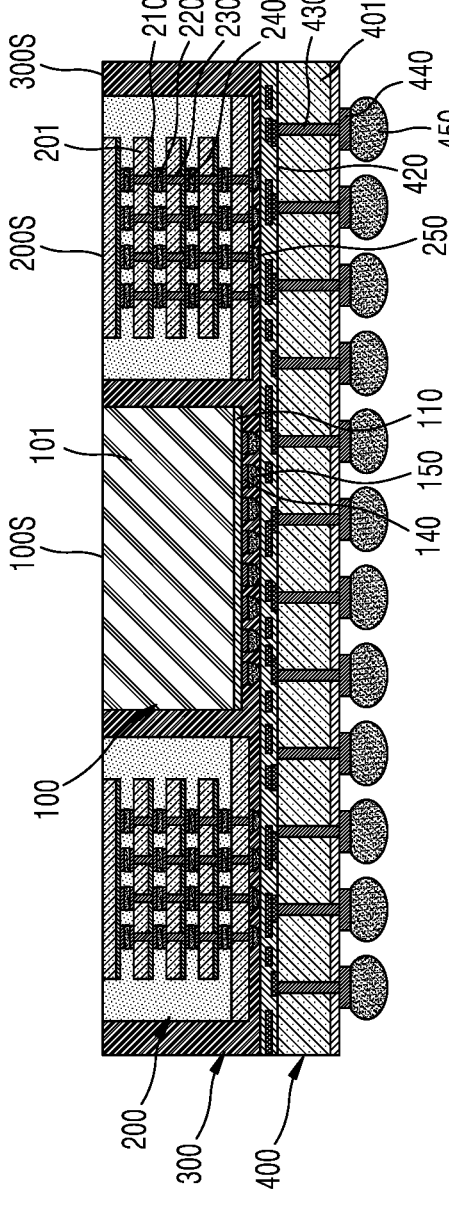
Figure 12A:
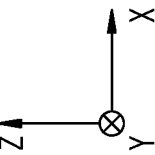

Referring to FIG. 12A, the first and second semiconductor chips 100 and 200 may be arranged on the interposer 400.

The first semiconductor chip 100 and the second semiconductor chip 200, which perform different functions, may be manufactured. The manufactured first and second semiconductor chips 100 and 200 may be mounted on the upper portion of the interposer 400, and a molding layer 300 may be formed to surround the first and second semiconductor chips 100 and 200.

Here, the molding layer 300 may expose the upper surfaces 100S and 200S of each of the first and second semiconductor chips 100 and 200. Accordingly, the upper surface 300S of the molding layer 300 may be coplanar with the upper surface 100S of the first semiconductor chip 100 and the upper surface 200S of the second semiconductor chip 200.

The interposer 400 may serve to electrically connect the first semiconductor chip 100 and the second semiconductor chip 200 with each other. In addition, an internal connection terminal 450 may be formed below the interposer 400.

Figure 12B:
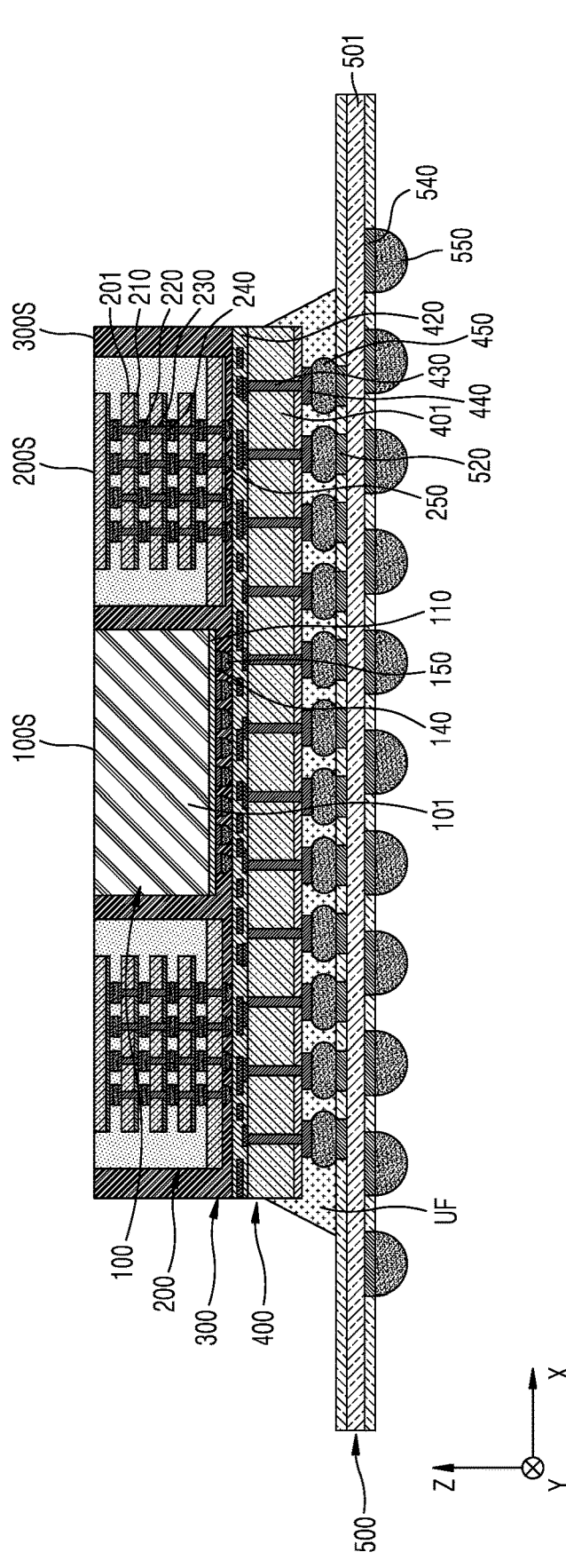

Referring to FIG. 12B, the interposer 400 on which the first and second semiconductor chips 100 and 200 are mounted may be arranged on the package substrate 500.

The interposer 400 may be arranged on the package substrate 500 such that the internal connection terminal 450 arranged below the interposer 400 is electrically connected to the upper surface of the package substrate 500.

An underfill UF may be formed between the interposer 400 and the package substrate 500. The underfill UF may be between the interposer 400 and the package substrate 500 to surround the internal connection terminal 450.

The package substrate 500 may include a printed circuit board. In the printed circuit board, the body portion 501 may be implemented by compressing, in a constant thickness, a polymer material, such as a thermosetting resin, or an epoxy resin such as a flame retardant 4 (FR-4), a bismaleimide triazine (BT), an Ajinomoto build up film (ABF), a phenol resin, or the like, to form a thin shape, and then forming a wiring which is a transmission path of an electrical signal through patterning after the copper foil is deposited on both sides.

Meanwhile, the printed circuit board may be divided into a single-sided PCB having a wiring formed only on one side and a double-sided PCB having a wiring formed on both sides. In addition, a PCB having a multi-layered structure may be implemented by forming three or more layers of copper foils using an insulator, which is referred to as a prepreg, and forming three or more wirings according to the number of layers of the copper foils.

Figure 12C:
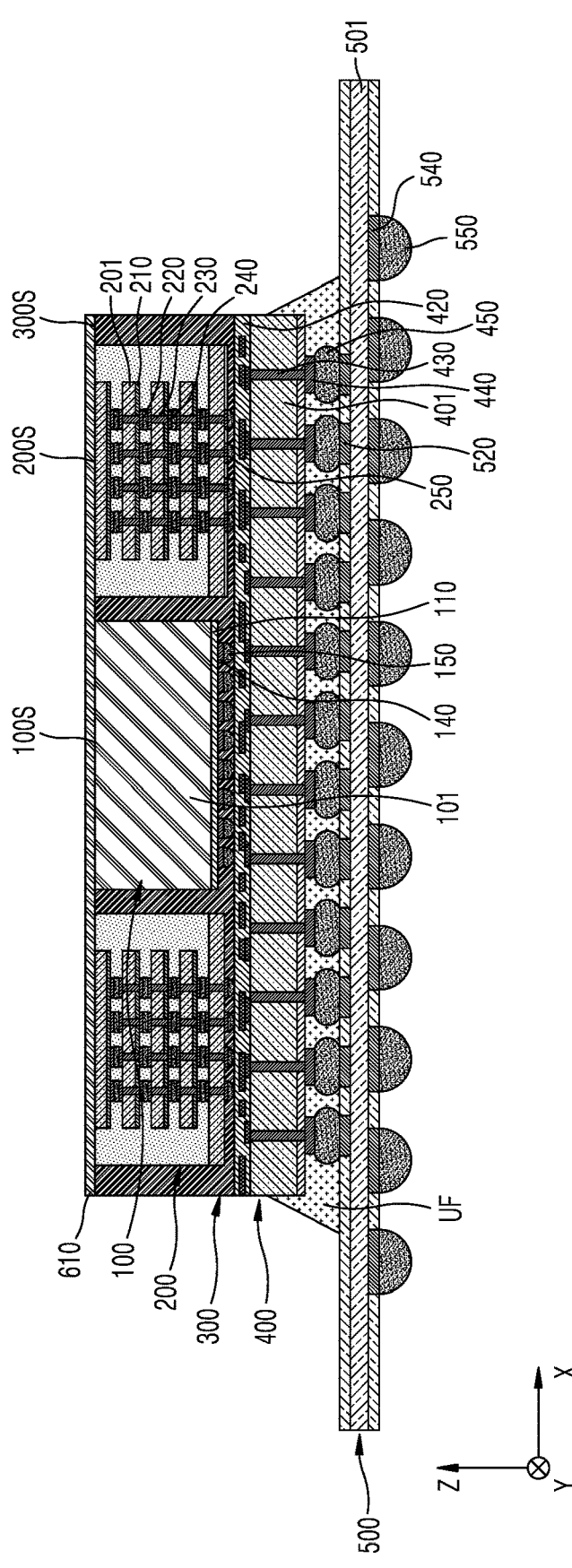

Referring to FIG. 12C, a moisture absorption barrier layer 610 is formed on the upper surface 100S of the first semiconductor chip 100, the upper surface 200S of the second semiconductor chip 200, and the upper surface 300S of the molding layer 300. The moisture absorption barrier layer 610 may be formed to entirely cover the upper surface 300S of the molding layer 300. In some embodiments, the moisture absorption barrier layer 610 may be formed to expose at least a portion of the upper surface 100S of the first semiconductor chip 100 and/or at least a portion of the upper surface 200S of the second semiconductor chip 200.

Figure 12D:
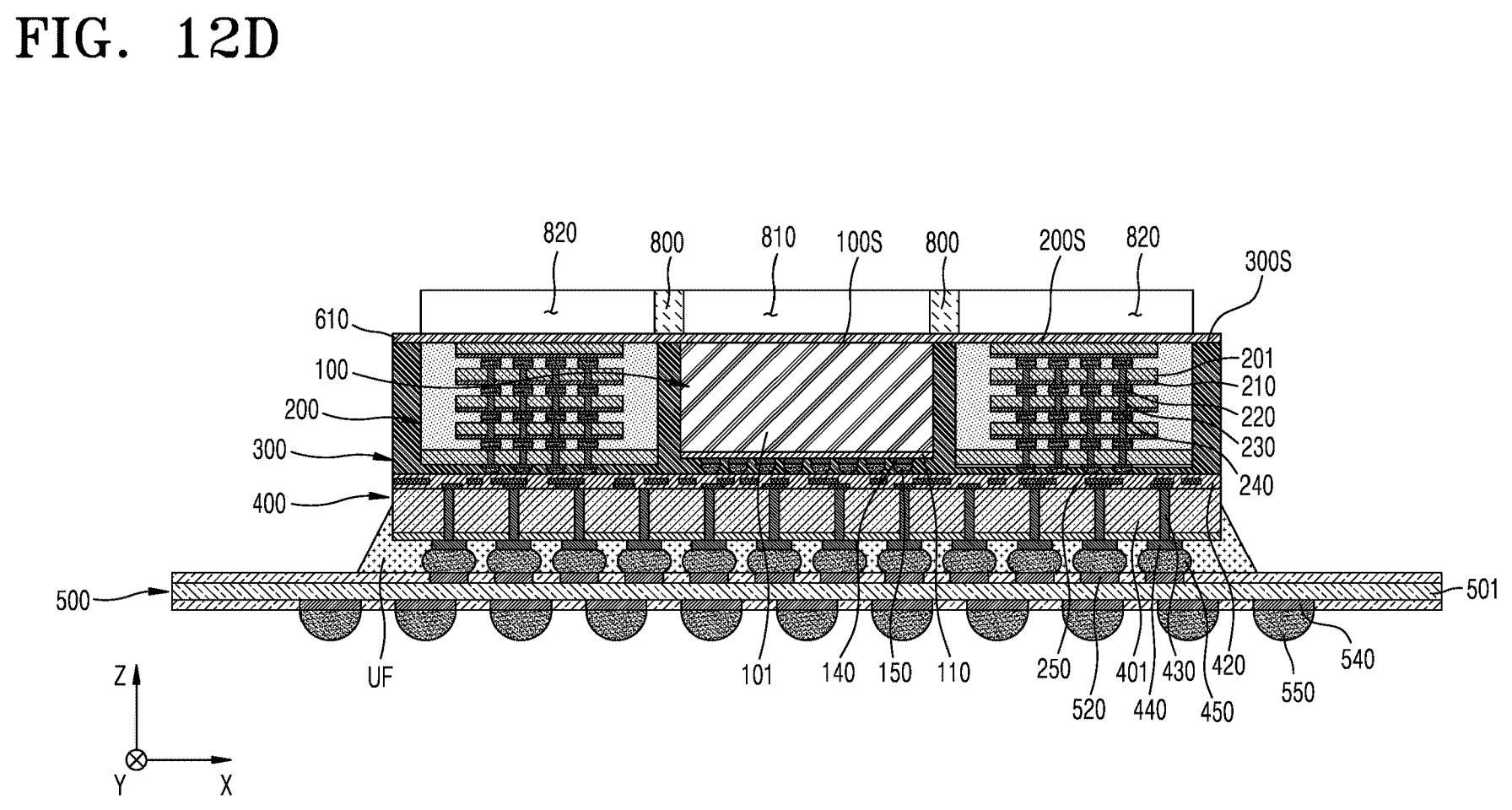

Referring to FIG. 12D, separation walls 800 are arranged on the moisture absorption barrier layer 610. The moisture absorption barrier layer 610 may cover the upper surface 300S of the molding layer 300 between the upper surface 100S of the first semiconductor chip 100 and the upper surface 200S of the second semiconductor chip 200. As the separation walls 800 are arranged on the moisture absorption barrier layer 610, a first cooling space 810 overlies the first semiconductor chip 100 and second cooling spaces 820 overlie the second semiconductor chip 200 may be formed.

Figure 12E:
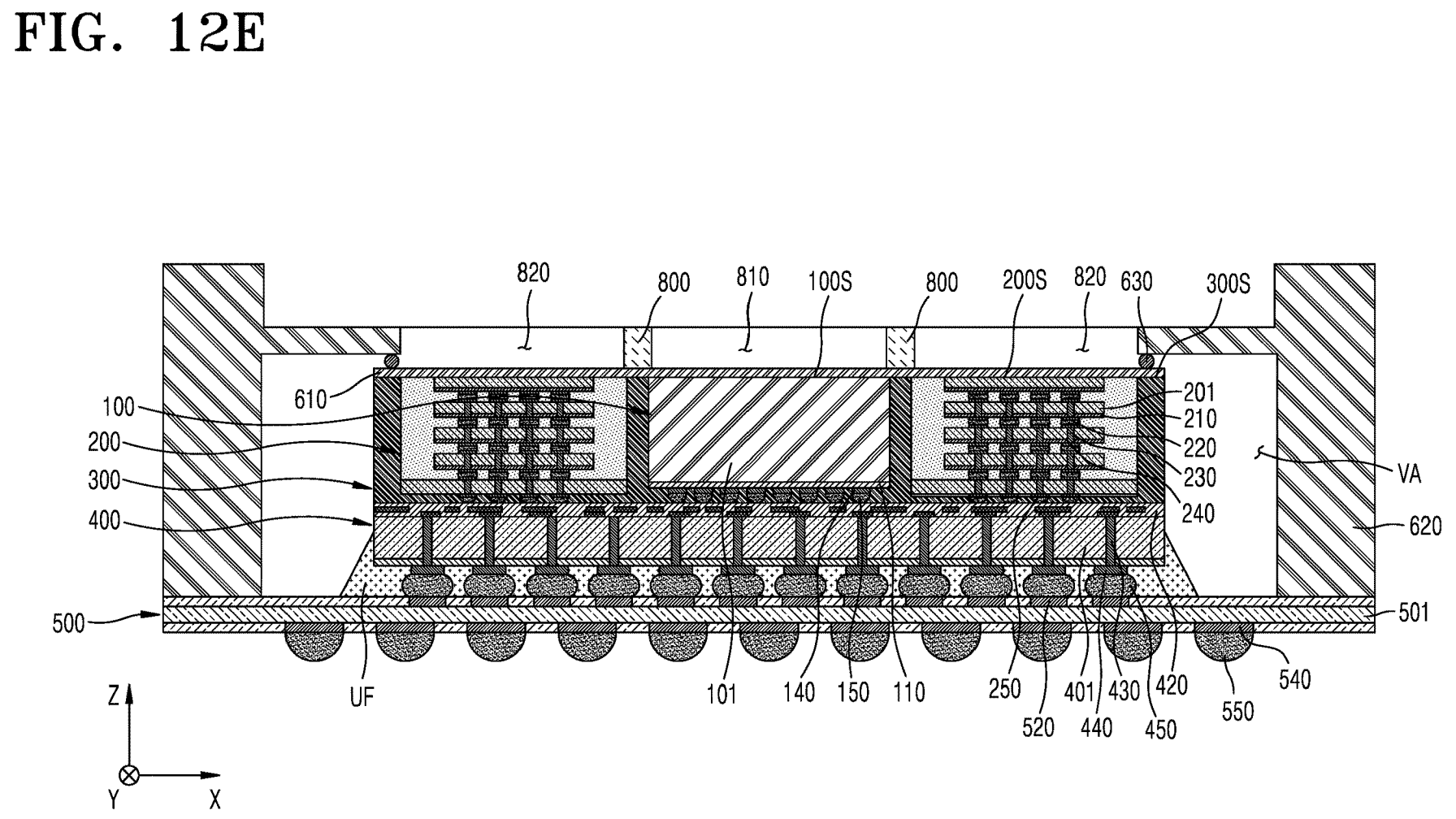

Referring to FIG. 12E, a sealing ring 630 is arranged on an outer portion of the moisture absorption barrier layer 610, and a support structure 620 is arranged on the package substrate 500. The sealing ring 630 is arranged between the support structure 620 and the moisture absorption barrier layer 610 so that a gap between the support structure 620 and the moisture absorption barrier layer 610 may be removed (i.e., the gap is filled by the sealing ring 630).

Figure 12F:
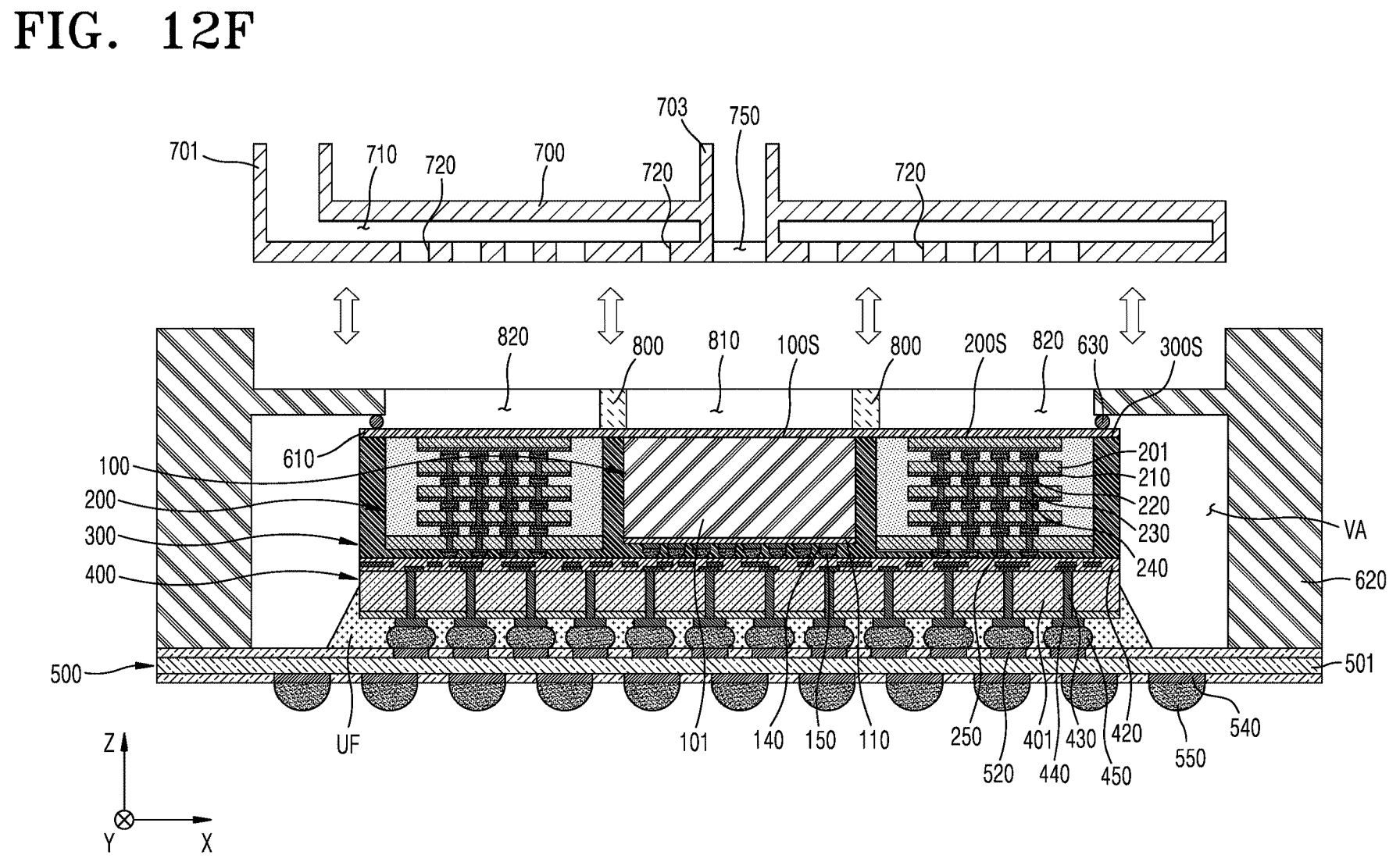
Figure 12G:
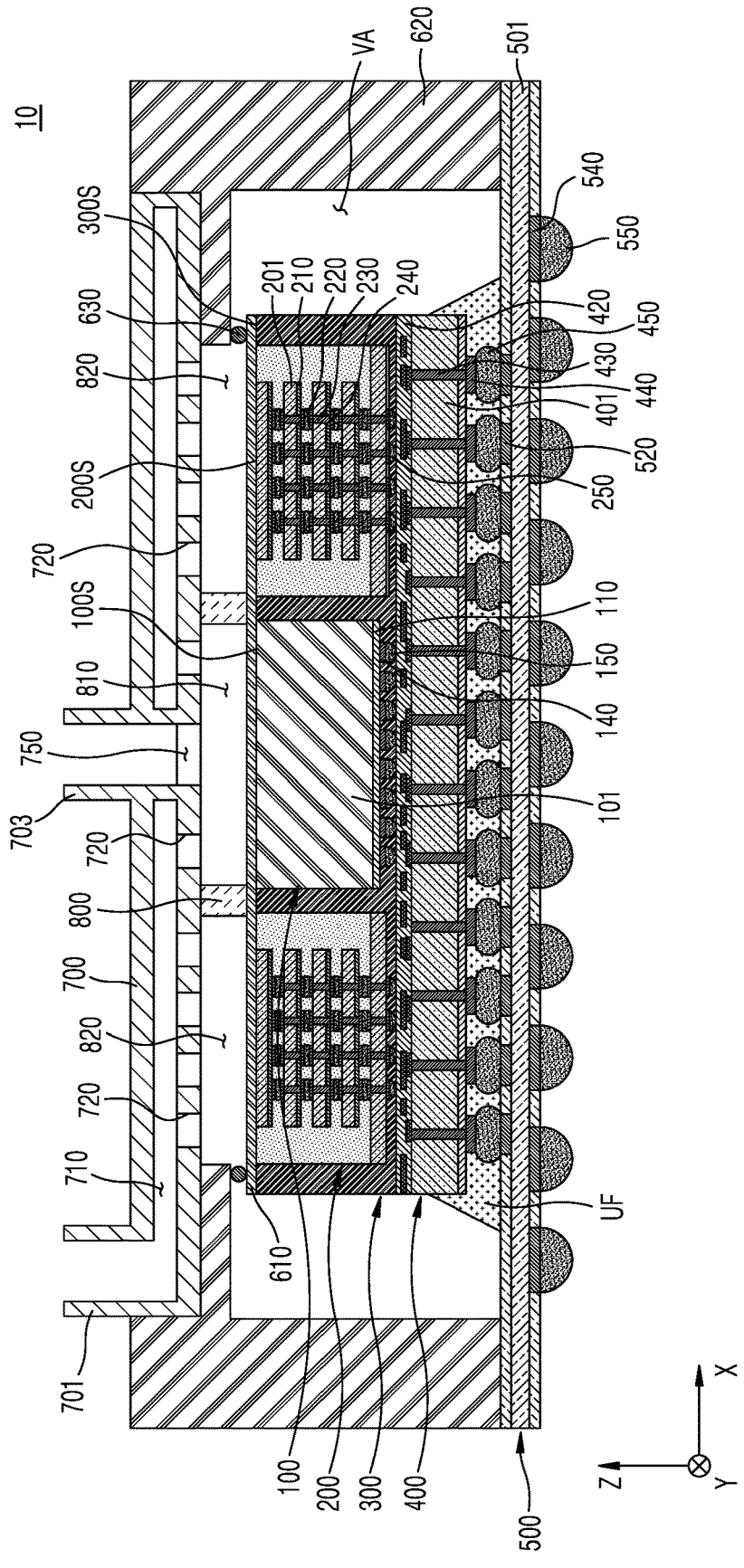

Referring to FIGS. 12F and 12G, the heat dissipation structure 700 is arranged on the support structure 620 and the separation walls 800. The heat dissipation structure 700 is inserted into a mounting groove provided on the upper side of the support structure 620, and may cover the first cooling space 810 and the second cooling space 820. When the arrangement of the heat dissipation structure 700 is completed, the cooling channel 710 of the heat dissipation structure 700 may communicate with the first cooling space

810 and/or the second cooling spaces 820 through the plurality of apertures 720, and the outflow channel 750 of the heat dissipation structure 700 may communicate with the first cooling space 810.

Referring to FIG. 4A, in order to configure the cooling system CS for the semiconductor package 10, the water cooling pump 910 may be connected to the inlet 701 of the heat dissipation structure 700, and the heat dissipater 920 may be connected to the outlet 703 of the heat dissipation structure 700. The water cooling pump 910 may be connected to the inlet 701 of the heat dissipation structure 700 through a pipe, and may supply the cooling fluid CT to the inlet 701 of the heat dissipation structure 700. The heat dissipater 920 may be connected to the outlet 703 of the heat dissipation structure 700 through a pipe, collect the cooling fluid CT discharged through the outlet 703 of the heat dissipation structure 700, and cool the cooling fluid CT. The cooling fluid CT provided by the water cooling pump 910 may flow along a flow path provided to the semiconductor package 10 to cool the semiconductor package 10, and then may be collected to the heat dissipater 920.

While the inventive concept has been particularly shown and described with reference to embodiments thereof, it will be understood that various changes in form and details may be made therein without departing from the scope of the following claims.

What is claimed is:

1. A semiconductor package comprising:
a package substrate;
an interposer on the package substrate;
a first semiconductor chip on the interposer;
at least one second semiconductor chip on the interposer;
a molding layer extending around the first semiconductor chip and the at least one second semiconductor chip;
a barrier layer on an upper surface of the molding layer;
a separation wall on the barrier layer, the separation wall defining a first cooling space adjacent the first semiconductor chip and a second cooling space adjacent the at least one second semiconductor chip, wherein the separation wall is configured to allow a cooling fluid to flow through a porous material thereof between the first cooling space and the second cooling space; and
a heat dissipation structure on the separation wall adjacent the first cooling space and the second cooling space, wherein
the heat dissipation structure comprises:
an inlet;
an outlet;
a cooling channel in fluid communication with the inlet, the first cooling space and the second cooling space, wherein the cooling channel is configured to receive the cooling fluid from the inlet and direct the cooling fluid into the first cooling space and the second cooling space; and
an outflow channel in fluid communication with the first cooling space and the outlet, wherein the outflow channel is configured to discharge the cooling fluid from the first cooling space through the outlet.

2. The semiconductor package of claim 1, further comprising:
a support structure that supports the heat dissipation structure; and
a sealing ring between the barrier layer and the support structure.

3. The semiconductor package of claim 1, wherein the cooling channel is configured to provide the cooling fluid to the first cooling space and the second cooling space via a plurality of apertures formed in the heat dissipation structure.

4. The semiconductor package of claim 1, wherein
the upper surface of the molding layer is coplanar with an upper surface of the first semiconductor chip and an upper surface of the at least one second semiconductor chip, and
the separation wall extends along a boundary between the first semiconductor chip and the molding layer and a boundary between the at least one second semiconductor chip and the molding layer.

5. The semiconductor package of claim 1, wherein
the first cooling space is in fluid communication with an upper surface of the first semiconductor chip through a first opening in the barrier layer, and
the barrier layer is on the upper surface of the molding layer and an upper surface of the at least one second semiconductor chip.

6. The semiconductor package of claim 1, wherein
the first cooling space is in fluid communication with an upper surface of the first semiconductor chip through a first opening in the barrier layer, and
the second cooling space is in fluid communication with an upper surface of the at least one second semiconductor chip through a second opening in the barrier layer.

7. The semiconductor package of claim 1, further comprising a plurality of structures extending from the barrier layer within the first cooling space, wherein the plurality of structures are configured to induce turbulence in the cooling fluid flowing in the first cooling space.

8. The semiconductor package of claim 1, wherein the outlet is adjacent to a center of an upper surface of the first semiconductor chip, and wherein the inlet is spaced apart from the outlet.

9. The semiconductor package of claim 8, wherein
the outlet is positioned above the first semiconductor chip, and
the inlet is not positioned above the first semiconductor chip.

10. The semiconductor package of claim 8, wherein the outlet and the inlet are positioned above the first semiconductor chip.

11. The semiconductor package of claim 8, wherein
the heat dissipation structure further comprises:
a second inlet in fluid communication with the cooling channel and configured to receive the cooling fluid; and
a second outlet in fluid communication with the cooling channel and configured to discharge the cooling fluid.

12. The semiconductor package of claim 1, wherein
the at least one second semiconductor chip comprises a first plurality of second semiconductor chips adjacent one side of the first semiconductor chip and a second plurality of second semiconductor chips adjacent an opposite second side of the first semiconductor chip, and
the cooling channel has a serpentine configuration and overlies the first plurality of second semiconductor chips and the second plurality of second semiconductor chips.

13. The semiconductor package of claim 12, wherein
the cooling channel comprises a first linear portion that overlies the first plurality of second semiconductor chips, and a second linear portion that overlies the second plurality of second semiconductor chips.

14. The semiconductor package of claim 1, wherein the first semiconductor chip comprises a logic chip, the at least one second semiconductor chip comprises a memory chip, the separation wall comprises a metal foam, and the barrier layer comprises a metal.

15. A semiconductor package comprising:

a plurality of semiconductor chips;

a molding layer extending around the plurality of semiconductor chips;

a barrier layer on an upper surface of the molding layer and comprising a metal;

a separation wall on the barrier layer, the separation wall defining a plurality of cooling spaces adjacent the plurality of semiconductor chips and to allow a cooling fluid to flow through a porous material thereof between the plurality of cooling spaces; and a heat dissipation structure adjacent the plurality of cooling spaces and contacting the separation wall, wherein the heat dissipation structure comprises:

an inlet;

an outlet;

a cooling channel in fluid communication with the inlet and the plurality of cooling spaces, wherein the cooling channel is configured to receive the cooling fluid from the inlet and direct the cooling fluid into the plurality of cooling spaces; and an outflow channel in fluid communication with the plurality of cooling spaces and the outlet, wherein the outflow channel is configured to discharge the cooling fluid from the plurality of cooling spaces through the outlet.

16. The semiconductor package of claim 15, further comprising:

a support structure that supports the heat dissipation structure, the support structure defining an internal space within which the plurality of semiconductor chips are located; and a sealing ring between the barrier layer and the support structure, wherein the upper surface of the molding layer is coplanar with upper surfaces of the plurality of semiconductor chips, and the sealing ring extends around the separation wall and the plurality of cooling spaces.

17. The semiconductor package of claim 15, wherein the plurality of semiconductor chips comprise a memory chip and a logic chip, and the plurality of cooling spaces comprise:

a first cooling space adjacent the logic chip, the first cooling space in fluid communication with the outflow channel and the outlet; and a second cooling space adjacent the memory chip, the second cooling space in fluid communication with the cooling channel and the inlet.

18. A cooling system for cooling a semiconductor package, the cooling system comprising:

a package substrate;

an interposer on the package substrate;

a first semiconductor chip on the interposer;

at least one second semiconductor chip on the interposer;

a molding layer extending around the first semiconductor chip and the at least one second semiconductor chip;

a barrier layer on an upper surface of the molding layer;

a separation wall on the barrier layer, the separation wall defining a first cooling space adjacent the first semiconductor chip and a second cooling space adjacent the at least one second semiconductor chip, wherein the separation wall is configured to allow a cooling fluid to flow between the first cooling space and the second cooling space; and a heat dissipation structure on the separation wall adjacent the first cooling space and the second cooling space, wherein the heat dissipation structure comprises an inlet, an outlet, a cooling channel in fluid communication with the inlet and the second cooling space, and an outflow channel in fluid communication with the first cooling space and the outlet;

a water cooling pump configured to provide the cooling fluid to the inlet of the heat dissipation structure; and a heat dissipater configured to collect the cooling fluid discharged from the outlet of the heat dissipation structure, wherein the cooling channel is configured to provide the cooling fluid into the second cooling space to cool the at least one second semiconductor chip, and the separation wall is configured to provide the cooling fluid through porous material thereof from the second cooling space into the first cooling space to cool the first semiconductor chip.

19. The cooling system of claim 18, wherein the cooling fluid comprises deionized water and nanoparticles.

20. The cooling system of claim 18, wherein the heat dissipation structure further comprises apertures through which the cooling fluid is provided from the cooling channel into the second cooling space.

* * * * *